(12) United States Patent
Chen et al.

(10) Patent No.: US 9,565,793 B2
(45) Date of Patent: Feb. 7, 2017

(54) ENVIRONMENTAL SENSITIVE ELECTRONIC DEVICE PACKAGE

(71) Applicant: Industrial Technology Research Institute, Hsinchu (TW)

(72) Inventors: Kuang-Jung Chen, Hsinchu County (TW); Jia-Chong Ho, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/051,460

(22) Filed: Oct. 11, 2013

(65) Prior Publication Data

US 2014/0118947 A1 May 1, 2014

Related U.S. Application Data

(60) Provisional application No. 61/720,408, filed on Oct. 31, 2012.

(30) Foreign Application Priority Data

May 17, 2013 (TW) .............................. 102117573 A

(51) Int. Cl.
*H05K 1/02* (2006.01)
*H05K 1/18* (2006.01)
(Continued)

(52) U.S. Cl.
CPC ......... *H05K 7/20963* (2013.01); *H01L 51/529* (2013.01); *H01L 51/5246* (2013.01);
(Continued)

(58) Field of Classification Search
CPC  H05K 7/20963; H05K 1/0201; H05K 1/0203; H05K 2201/05; H05K 2201/10136; H05K 2201/10128; H01L 51/5246; H01L 51/5259; H01L 51/529; H01L 2924/0002; H01L 2924/00; H01L 21/56; H01L 23/293; H01L 23/3121; H01L 23/564; H01L 51/5237; H01L 2924/12044; H01L 2251/5338; Y10T 29/49002
(Continued)

(56) References Cited

U.S. PATENT DOCUMENTS 7,652,424 B2   1/2010  Park et al.
7,830,086 B2 * 11/2010  Adachi et al. ................ 313/506
(Continued)

FOREIGN PATENT DOCUMENTS

JP   2010225362   10/2010
TW   I283914      7/2007
(Continued)

OTHER PUBLICATIONS

Fu et al., "Room Temperature Plasma Assisted Atomic Layer Deposition Al2O3 Film's Encapsulation Application in Organic Light Emitting Diodes," International Semiconductor Device Research Symposium (ISDRS), Dec. 7-9, 2011, pp. 1-2.
(Continued)

*Primary Examiner* — Ishwarbhai B Patel
(74) *Attorney, Agent, or Firm* — Jianq Chyun IP Office

(57) ABSTRACT

An environmental sensitive electronic device package including a first substrate, a second substrate, an environmental sensitive electronic device, at least one first side wall barrier structure, at least one thermal protrusion, and a first filler layer is provided. The second substrate is disposed above the first substrate. The environmental sensitive electronic device is disposed on the first substrate and located between the first substrate and the second substrate. The first side wall barrier structure is disposed on the second sub-
(Continued)

strate and located between the first substrate and the second substrate, wherein the first side wall barrier structure is located on at least one side of the environmental sensitive electronic device. The thermal protrusion is located on the second substrate. The first filler layer is located between the first substrate and the second substrate and covers the environmental sensitive electronic device, the first side wall barrier structure, and the thermal protrusion.

14 Claims, 13 Drawing Sheets

(51) Int. Cl.
*H05K 7/20* (2006.01)
*H01L 51/52* (2006.01)

(52) U.S. Cl.
CPC ....... *H01L 51/5259* (2013.01); *H05K 1/0201* (2013.01); *H05K 1/18* (2013.01); *H01L 2924/0002* (2013.01)

(58) Field of Classification Search
USPC ........ 174/250–268; 361/688, 749, 704, 760; 349/12, 153, 155; 257/678, 704, 778, 687
See application file for complete search history.

(56) References Cited

U.S. PATENT DOCUMENTS

| | | | |
|---|---|---|---|
| 8,093,512 B2 | 1/2012 | Chen et al. | |
| 8,288,861 B2 * | 10/2012 | Buchhauser et al. | 257/704 |
| 9,007,538 B2 * | 4/2015 | Chen | 349/12 |
| 9,161,460 B2 * | 10/2015 | Ha | H05K 3/383 |
| 2002/0125484 A1 * | 9/2002 | Silvernail | H01L 25/046 |
| | | | 257/79 |
| 2004/0191566 A1 * | 9/2004 | Kikuchi et al. | 428/690 |
| 2009/0167132 A1 | 7/2009 | Bae et al. | |
| 2010/0244057 A1 | 9/2010 | Ryu et al. | |
| 2010/0258346 A1 * | 10/2010 | Chen et al. | 174/521 |
| 2011/0045732 A1 * | 2/2011 | Suzuki | H01L 51/5237 |
| | | | 445/25 |
| 2011/0052857 A1 | 3/2011 | Suzuki et al. | |
| 2011/0089587 A1 | 4/2011 | Botelho et al. | |
| 2012/0205698 A1 * | 8/2012 | Yamazaki et al. | 257/98 |

FOREIGN PATENT DOCUMENTS

| | | |
|---|---|---|
| TW | I284422 | 7/2007 |
| TW | 200942070 | 10/2009 |
| TW | 201014446 | 4/2010 |
| TW | 201037799 | 10/2010 |
| TW | 201106511 | 2/2011 |
| TW | M401870 | 4/2011 |
| TW | I357135 | 1/2012 |
| TW | I361466 | 4/2012 |

OTHER PUBLICATIONS

Wel et al., "B-Dry®: Edge Sealant for Sensitive Photovoltaic Modules," 37th IEEE Photovoltaic Specialists Conference (PVSC), Jun. 19-24, 2011, pp. 001371-001374.

Li et al., "Thin Film Encapsulation of OLED Displays with Organic-Inorganic Composite Film," 58th Electronic Components and Technology Conference (ECTC), May 27-30, 2008, pp. 1819-1824.

Wang et al., "Direct Encapsulation of Organic Light-Emitting Devices (OLEDs) Using Photo-Curable co-Polyacrylate/Silica Nanocomposite Resin," IEEE Transactions on Advanced Packaging 30 (3), Aug. 2007, pp. 421-427.

Sang et al., "Thin Film Encapsulation for OLED Display using Silicon Nitride and Silicon Oxide Composite Film," Electronic Packaging Technology and High Density Packaging (ICEPT-HDP), Aug. 8-11, 2011, pp. 1175-1178.

Zhang et al., "Effect of Encapsulation on OLED Characteristics with Anisotropic Conductive Adhesive," 2nd Electronics System-Integration Technology Conference (ESTC), Sep. 1-4, 2008, pp. 613-616.

"Office Action of Taiwan Counterpart Application", issued on Jun. 2, 2015, p. 1-p. 3.

"Office Action of Taiwan Counterpart Application" , issued on Nov. 17, 2015, p. 1-p. 6.

"Office Action of Taiwan Counterpart Application", issued on Jul. 29, 2016, p. 1-p. 8.

* cited by examiner

ENVIRONMENTAL SENSITIVE ELECTRONIC DEVICE PACKAGE

CROSS-REFERENCE TO RELATED APPLICATION

This application claims the priority benefits of U.S. provisional application Ser. No. 61/720,408, filed on Oct. 31, 2012 and Taiwan application serial no. 102117573, filed on May 17, 2013. The entirety of each of the above-mentioned patent applications is hereby incorporated by reference herein and made a part of this specification.

TECHNICAL FIELD

The technical field relates to a package.

BACKGROUND

With the progress of science and technology, information products that are light and slim, power saving, and that provide high image quality display have become indispensable portable tools to people nowadays. Among the information products, whether smart phones or tablet PCs or televisions, require a display device that serves as a user interface. Moreover, in view of the requirements of lightweight, slim appearance, high definition and low power consumption, it is organic light-emitting displays that have become widely used.

However, the organic light-emitting display is highly sensitive to moisture. Once an organic light-emitting device within the organic light-emitting display contacts moisture, phenomena of cathode oxidation and peeling of organic compounds may occur, resulting in decrease in display quality, and also reduction in life of the display due to accelerated aging of the organic light-emitting device. In addition, the organic light-emitting displays having a large display size have become the mainstream of current information products. As the number of the organic light-emitting devices or the area thereof increases, a problem of heat generation becomes severe. In brief, water and oxygen barrier properties and heat dissipation performance of the organic light-emitting displays have always been outstanding issues that urgently need to be solved.

SUMMARY

According to an exemplary embodiment of the disclosure, an environmental sensitive electronic device package is provided. The environmental sensitive electronic device package includes a first substrate, a second substrate, an environmental sensitive electronic device, at least one first side wall barrier structure, at least one thermal protrusion, and a first filler layer. The second substrate is disposed above the first substrate. The environmental sensitive electronic device is disposed on the first substrate and located between the first substrate and the second substrate. The first side wall barrier structure is disposed on the second substrate and located between the first substrate and the second substrate, wherein the first side wall barrier structure is located on at least one side of the environmental sensitive electronic device. The thermal protrusion is located on the second substrate. The first filler layer is located between the first substrate and the second substrate and covers the environmental sensitive electronic device, the first side wall barrier structure, and the thermal protrusion.

According to an exemplary embodiment of the disclosure, another environmental sensitive electronic device package is provided. The environmental sensitive electronic device package includes a first substrate, a second substrate, an environmental sensitive electronic device, a first filler layer, a third substrate, at least one side wall barrier structure, at least one thermal protrusion, and a second filler layer. The second substrate is disposed above the first substrate. The environmental sensitive electronic device is disposed on the first substrate and located between the first substrate and the second substrate. The first filler layer is located between the first substrate and the second substrate and covers the environmental sensitive electronic device. The third substrate is disposed below the first substrate, wherein the first substrate is located between the second substrate and the third substrate. The side wall barrier structure is disposed on the third substrate and located between the first substrate and the third substrate, wherein the side wall barrier structure is located on at least one side of the environmental sensitive electronic device. The thermal protrusion is located on the third substrate. The second filler layer is located between the first substrate and the third substrate and covers the side wall barrier structure and the thermal protrusion.

According to an exemplary embodiment of the disclosure, still another environmental sensitive electronic device package is provided. The environmental sensitive electronic device package includes a first substrate, a second substrate, an environmental sensitive electronic device, at least one first side wall barrier structure, a first thermal layer, a first thermal structure, and a first filler layer. The second substrate is disposed above the first substrate. The environmental sensitive electronic device is disposed on the first substrate and located between the first substrate and the second substrate. The first side wall barrier structure is disposed on the second substrate and located between the first substrate and the second substrate, wherein the first side wall barrier structure is located on at least one side of the environmental sensitive electronic device. The first thermal layer is disposed on the second substrate and located between the first substrate and the second substrate, wherein the first thermal layer covers the second substrate and the first side wall barrier structure. The first thermal structure is disposed on the first substrate and located between the first substrate and the second substrate, wherein the first thermal structure surrounds the first side wall barrier structure. The first filler layer is located between the first substrate and the second substrate and covers the first side wall barrier structure and the environmental sensitive electronic device, wherein the first thermal structure is engaged with the first thermal layer on the second substrate.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

An exemplary embodiment of the disclosure provides an environmental sensitive electronic device package configured to improve the problem of reduced life of an environmental sensitive electronic device due to moisture or overheating.

Figure 1A:
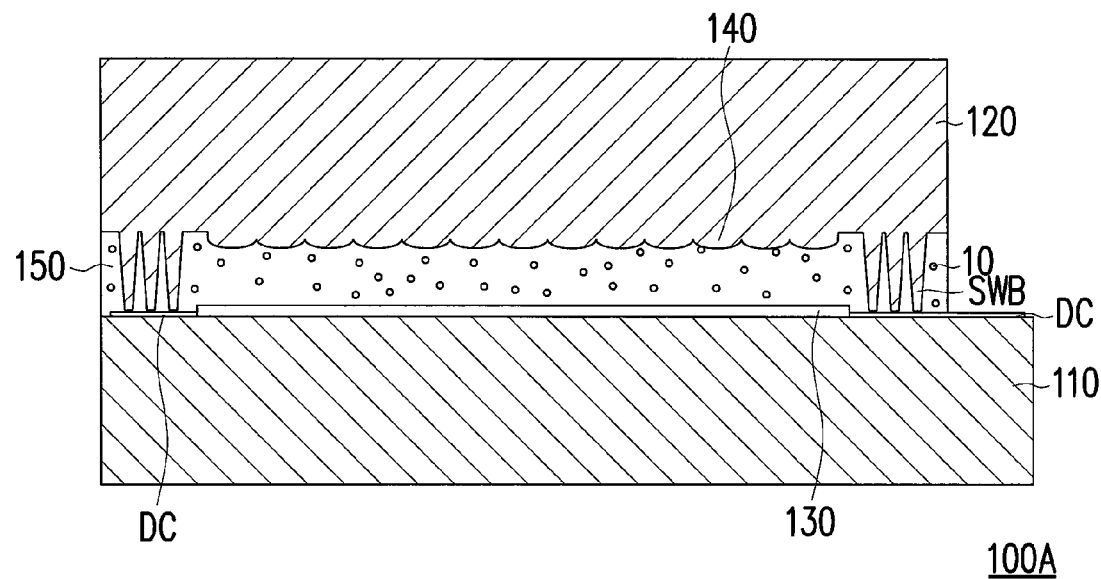
FIG. 1A is a schematic cross-sectional view illustrating an environmental sensitive electronic device package according to an exemplary embodiment.
Figure 1B:
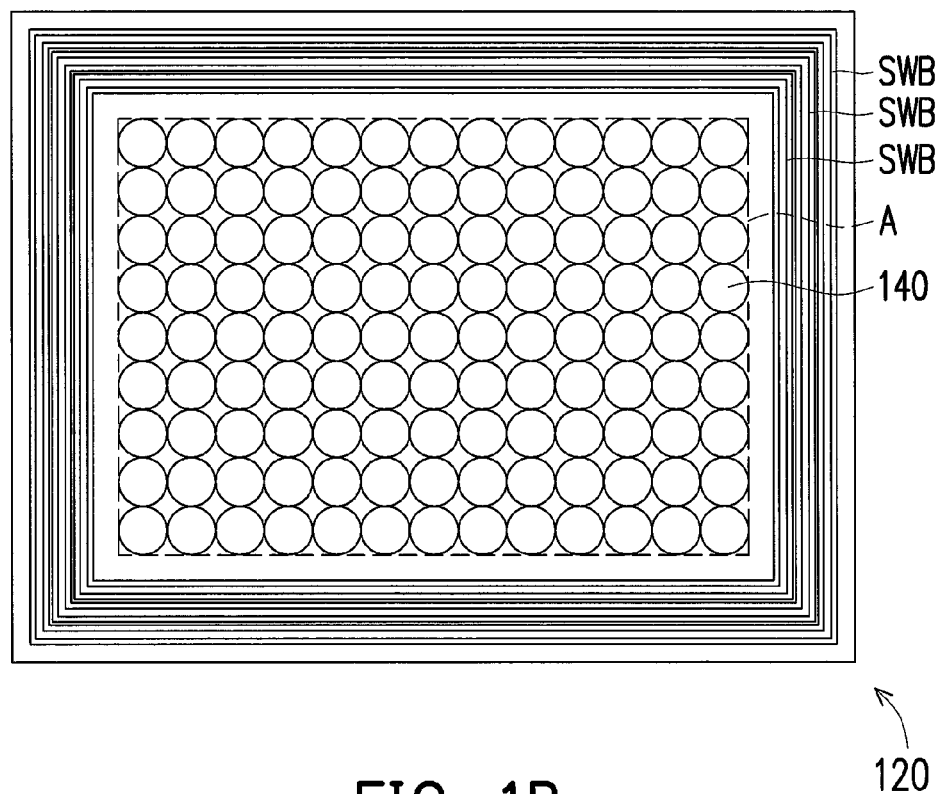
FIG. 1B is a bottom view of the environmental sensitive electronic device package in FIG. 1A.

FIG. 1A is a schematic cross-sectional view illustrating an environmental sensitive electronic device package according to an exemplary embodiment. FIG. 1B is a bottom view of the environmental sensitive electronic device package in FIG. 1A. Referring to FIG. 1A, in the present exemplary embodiment, an environmental sensitive electronic device package 100A includes a first substrate 110, a second substrate 120, an environmental sensitive electronic device 130, at least one first side wall barrier structure SWB, at least one thermal protrusion 140, and a first filler layer 150. The second substrate 120 is located above the first substrate 110. The environmental sensitive electronic device 130 is disposed on the first substrate 110 and located between the first substrate 110 and the second substrate 120. The first side wall barrier structure SWB is disposed on the second substrate 120 and located between the first substrate 110 and the second substrate 120, wherein the first side wall barrier structure SWB is located on at least one side of the environmental sensitive electronic device 130. The thermal protrusion 140 is located on the second substrate 120 and extends toward the first substrate 110. The first filler layer 150 is located between the first substrate 110 and the second substrate 120 and covers the environmental sensitive electronic device 130, the first side wall barrier structure SWB, and the thermal protrusion 140.

In the present exemplary embodiment, the first substrate 110 is, for example, a flexible substrate, wherein the material of the flexible substrate may be polyethylene terephthalate (PET), polyethylene naphthalate (PEN), polyethersulfone (PES), polymethyl methacrylate (PMMA), polycarbonate (PC), polyimide (PI) or metal foil. In addition, the environmental sensitive electronic device package 100A further includes a functional film (not illustrated), wherein the functional film is, for example, disposed on the first substrate 110 and located between the first substrate 110 and the environmental sensitive electronic device 130. In general, the functional film may be a touch panel, and the touch panel is, for example, a surface capacitive touch panel, a digital matrix touch panel (such as a projected capacitive touch panel) or an analog matrix touch panel. The functional film may also be a color filter or an electro-phoretic display (EPD). In brief, the environmental sensitive electronic device package of the disclosure has a touch sensing function.

In addition, in the present exemplary embodiment, the second substrate 120 is, for example, a metal substrate, and the second substrate 120 may be a flexible metal substrate having better heat conduction and heat dissipation properties. The second substrate 120 may also be a flexible substrate identical or similar to the first substrate 110, wherein the material of the flexible substrate may be polyethylene terephthalate (PET), polyethylene naphthalate (PEN), polyethersulfone (PES), polymethyl methacrylate (PMMA), polycarbonate (PC) or polyimide (PI). The disclosure is not limited hereto.

In addition, the environmental sensitive electronic device 130 is, for example, an active environmental sensitive electronic display device or a passive environmental sensitive electronic display device, wherein the active environmental sensitive electronic display device is, for example, an active-matrix organic light-emitting diode (AM-OLED), an active-matrix electro-phoretic display (AM-EPD) commonly known as electronic paper, an active-matrix liquid crystal display (AM-LCD), or an active-matrix blue phase liquid crystal display. The passive environmental sensitive electronic display device is, for example, a passive-matrix OLED (PM-OLED) or a super twisted nematic liquid crystal display (STN-LCD).

In addition, as shown in FIG. 1A, in the present exemplary embodiment, the first side wall barrier structure SWB is located on the second substrate 120 and extends toward the first substrate 110, wherein a cross-section of the first side wall barrier structure SWB perpendicular to the first substrate 110 is, for example, in a shape of trapezoid. This cross-section may also be in a shape of rectangle, other different types of polygons, circle or ellipse. In general, the material of the first side wall barrier structure SWB includes metal material, and the metal material is, for example, metal such as iron, aluminum, copper, magnesium, chromium, gold, silver, molybdenum and titanium, or alloy material thereof. Moreover, the first side wall barrier structure SWB is formed on the second substrate 120 by processes such as photolithography and etching, imprinting, or precision lathing. In the present exemplary embodiment, the first side wall barrier structure SWB and the second substrate 120, for example, comprise the same material. In other exemplary embodiments that are not illustrated, the first side wall barrier structure SWB and the second substrate 120 may comprise different materials. The disclosure is not limited hereto.

In addition, as shown in FIG. 1B, in the present exemplary embodiment, the first side wall barrier structure SWB is, for example, a closed structure that surrounds the environmental sensitive electronic device 130 and is configured to block water vapor and oxygen from the outside, wherein the first side wall barrier structure SWB surrounds the thermal protrusion 140. As shown in FIG. 1A, the thermal protrusion 140 and the second substrate 120 in the present exemplary embodiment, for example, comprise the same material, wherein the thermal protrusion 140 is formed on the second substrate 120 by, for example, processes such as photolithography and etching, imprinting, sandblasting or precision lathing, and is arranged in array. Moreover, materials of the second substrate 120 and the thermal protrusion 140 are mainly metal material, for example, metal such as iron, aluminum, copper, magnesium, chromium, gold, silver, molybdenum and titanium, or alloy material thereof.

In other exemplary embodiments that are not illustrated, the thermal protrusion 140 and the second substrate 120 may comprise different materials, wherein the material of the second substrate 120 is, for example, metal material, for example, metal such as iron, aluminum, copper, magnesium, chromium, gold, silver, molybdenum and titanium, or alloy material thereof. The material of the thermal protrusion 140 may mainly be inorganic material, such as silicide, aluminide, diamond and diamond-like compound. The thermal protrusion 140 is formed on the second substrate 120 by processes such as chemical vapor deposition, sputtering and spray coating and is arranged in array.

In detail, as shown in FIGS. 1A and 1B, in the present exemplary embodiment, the number of the thermal protrusion 140 is, for example, plural, and the thermal protrusions 140 are arranged in array in an area A on the second substrate 120, wherein the area A is roughly as large as the size of the environmental sensitive electronic device 130. The area of the area A may be adjusted depending on product design requirements. In other words, the area of the area A may be equal to, larger than or smaller than the size of the environmental sensitive electronic device 130. Accordingly, heat energy generated from the environmental sensitive electronic device 130 is transmitted to the thermal protrusion 140 via the first filler layer 150, and afterwards, transmitted from the thermal protrusion 140 to the second substrate 120 to be diffused outside.

In the present exemplary embodiment, the thermal protrusion 140 of the disclosure effectively enhances efficiency of heat conduction and heat dissipation. In addition, in the present exemplary embodiment, a base area of the thermal protrusion 140 is, for example, in a shape of circle. In other exemplary embodiments that are not illustrated, the base area of the thermal protrusion 140 may be in a shape of triangle, other different types of polygons, or ellipse. The disclosure is not limited hereto.

In addition, the first filler layer 150 is formed by, for example, UV light curing or thermal curing an adhesive material. The material of the adhesive material is, for example, acrylic resin or epoxy resin. In the present exemplary embodiment, before curing, the first filler layer 150 is in the form of, for example, a liquid type adhesive material or a sheet type adhesive material. Further, the first filler layer 150 further includes a heat conductive material 10, wherein the heat conductive material 10 is, for example, artificial diamond, diamond-like compound and diamond-like carbon, and is distributed throughout the first filler layer 150 in the form of nano-sized particles, which effectively enhances the heat conduction efficiency.

In addition, the environmental sensitive electronic device package 100A of the present exemplary embodiment further includes a conductive wire DC, wherein the conductive wire DC is disposed on the first substrate 110 and located between the first substrate 110 and the second substrate 120. The conductive wire DC is electrically connected to the environmental sensitive electronic device 130, wherein the conductive wire DC is configured to receive an input signal and convert the input signal to produce an output signal, wherein the output signal is, for example, a display control signal. The conductive wire DC outputs the display control signal to control the environmental sensitive electronic device 130.

Another exemplary embodiment is given below to describe the design of an environmental sensitive electronic device package 100B, wherein the same or similar elements are denoted by the same or similar reference numbers, and the same or similar elements have the same or similar characteristics, and thus details will not be repeated herein.

Figure 2A:
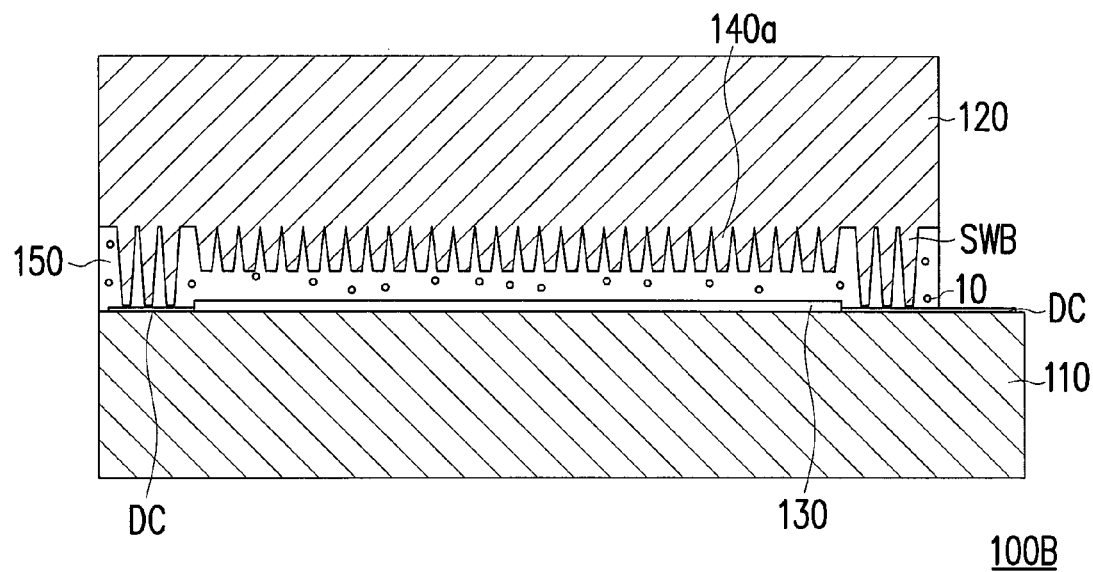
FIG. 2A illustrates an environmental sensitive electronic device package according to another exemplary embodiment.
Figure 2B:
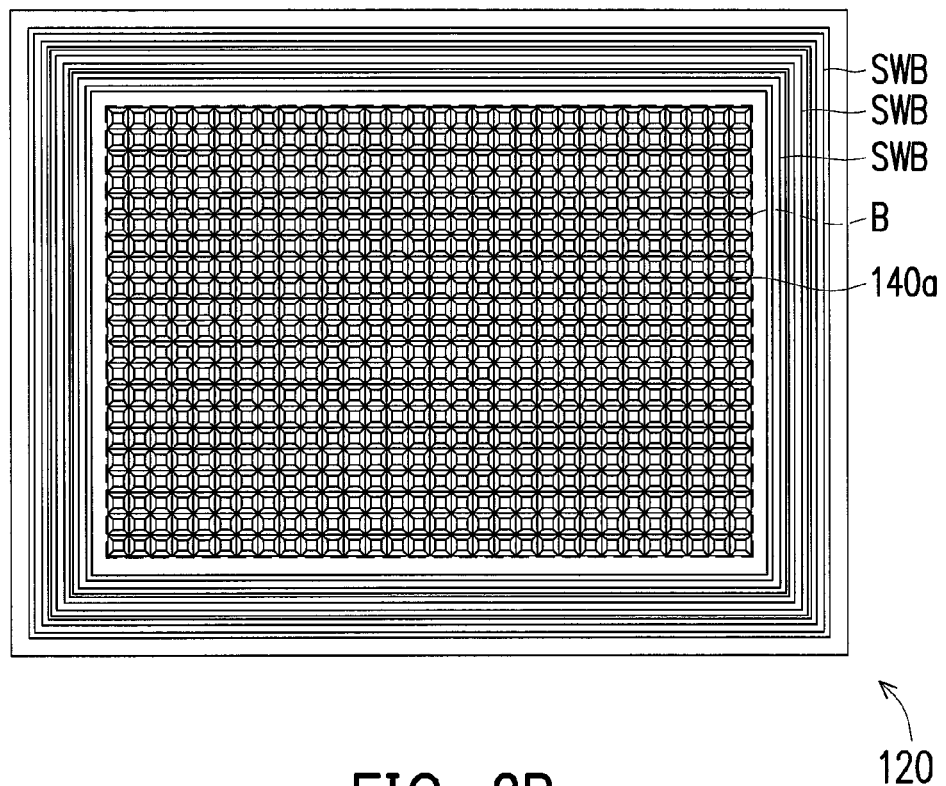
FIG. 2B is a bottom view of the environmental sensitive electronic device package in FIG. 2A.

FIG. 2A illustrates an environmental sensitive electronic device package according to another exemplary embodiment. FIG. 2B is a bottom view of the environmental sensitive electronic device package in FIG. 2A. As shown in FIGS. 2A and 2B, the environmental sensitive electronic device package 100B in FIG. 2A is similar to the environmental sensitive electronic device package 100A in FIG. 1A, and the main difference therebetween lies in that a base area of a thermal protrusion 140a of the environmental sensitive electronic device package 100B in FIG. 2A is, for example, in a shape of square. In other exemplary embodiments that are not illustrated, the base area of the thermal protrusion 140a may be in a shape of triangle, other different types of polygons, or ellipse. The disclosure is not limited hereto.

The number of the thermal protrusion 140a is, for example, plural, and the thermal protrusions 140a are arranged in array in an area B on the second substrate 120, wherein the area B is roughly as large as the size of the environmental sensitive electronic device 130. The area of the area B may be adjusted depending on product design requirements. In other words, the area of the area B may be equal to, larger than or smaller than the size of the environmental sensitive electronic device 130. The heat energy generated from the environmental sensitive electronic device 130 is transmitted to the thermal protrusion 140a via the first filler layer 150, and afterwards, transmitted from the thermal protrusion 140a to the second substrate 120 to be diffused outside. In brief, the thermal protrusion 140a of the disclosure effectively enhances efficiency of heat conduction and heat dissipation.

Figure 3A:
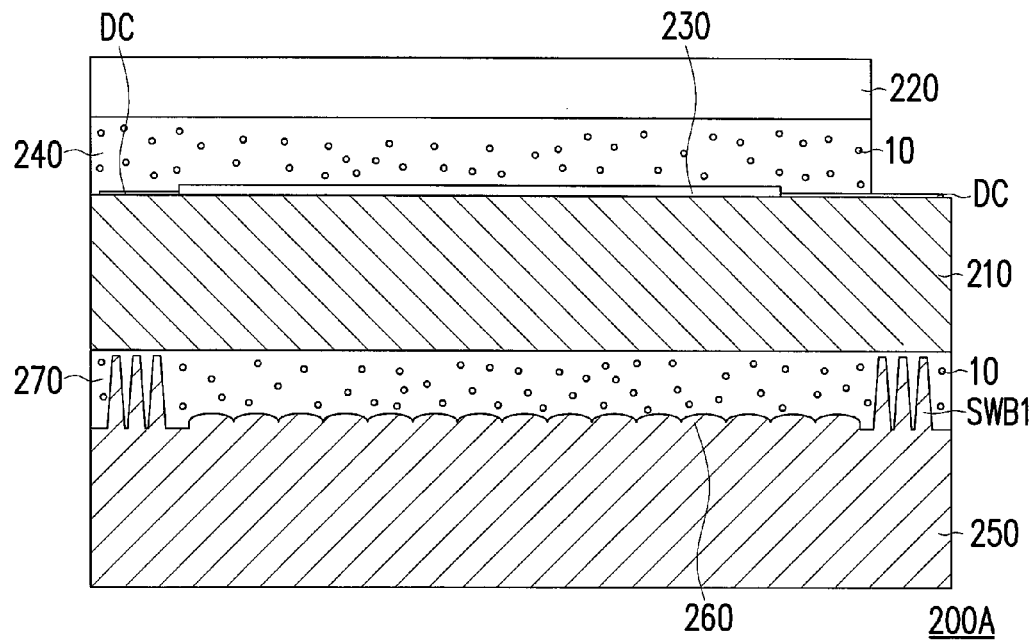
FIG. 3A is a schematic cross-sectional view illustrating an environmental sensitive electronic device package according to another exemplary embodiment.
Figure 3B:
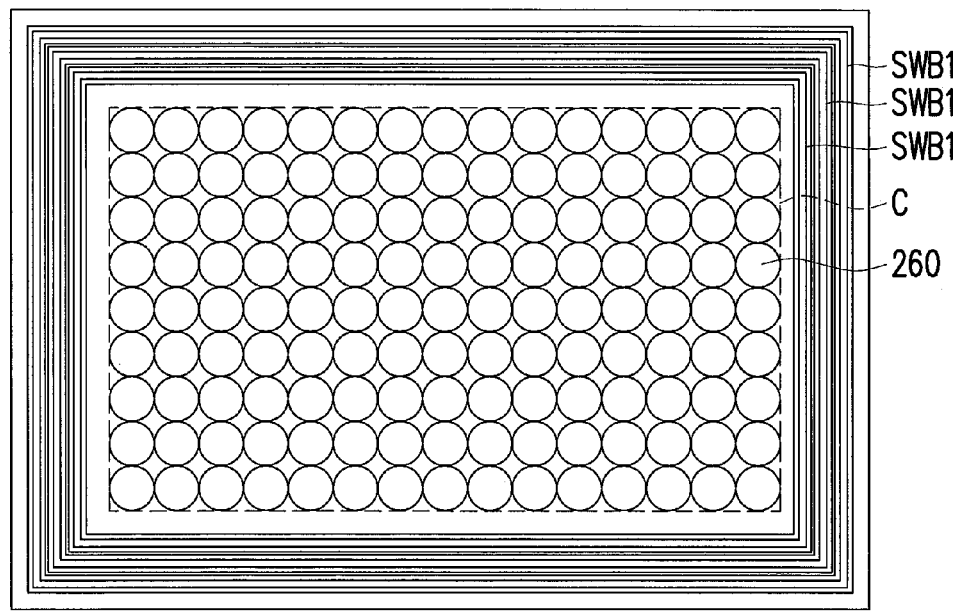
FIG. 3B is a top view of a third substrate of the environmental sensitive electronic device package in FIG. 3A.

FIG. 3A is a schematic cross-sectional view illustrating an environmental sensitive electronic device package according to another exemplary embodiment. FIG. 3B is a top view of a third substrate of the environmental sensitive electronic device package in FIG. 3A. Referring to FIG. 3A, an environmental sensitive electronic device package 200A includes a first substrate 210, a second substrate 220, an environmental sensitive electronic device 230, a first filler layer 240, a third substrate 250, at least one side wall barrier structure SWB1, at least one thermal protrusion 260, and a second filler layer 270. The second substrate 220 is disposed above the first substrate 210. The environmental sensitive electronic device 230 is disposed on the first substrate 210 and located between the first substrate 210 and the second substrate 220. The first filler layer 240 is located between the first substrate 210 and the second substrate 220 and covers the environmental sensitive electronic device 230. The third substrate 250 is disposed below the first substrate 210, wherein the first substrate 210 is located between the second substrate 220 and the third substrate 250. The side wall barrier structure SWB1 is disposed on the third substrate 250 and located between the first substrate 210 and the third substrate 250, wherein the side wall barrier structure SWB1 is located on at least one side of the environmental sensitive electronic device 230. The thermal protrusion 260 is located on the third substrate 250 and extends toward the first substrate 210. The second filler layer 270 is located between the first substrate 210 and the third substrate 250 and covers the side wall barrier structure SWB1 and the thermal protrusion 260.

In the present exemplary embodiment, the first substrate 210 and the second substrate 220 are, for example, flexible substrates, wherein the material of the flexible substrates may be polyethylene terephthalate (PET), polyethylene naphthalate (PEN), polyethersulfone (PES), polymethyl methacrylate (PMMA), polycarbonate (PC), polyimide (PI) or metal foil. In addition, the environmental sensitive electronic device package 200A further includes a functional film (not illustrated), wherein the functional film is, for example, disposed on the second substrate 220 and located between the first substrate 210 and the second substrate 220. In general, the functional film may be a touch panel, and the touch panel is, for example, a surface capacitive touch panel, a digital matrix touch panel (such as a projected capacitive touch panel) or an analog matrix touch panel. Of course, the functional film may also be a color filter or an electro-phoretic display (EPD). In brief, the environmental sensitive electronic device package of the disclosure has a touch sensing function.

In addition, the environmental sensitive electronic device 230 is, for example, an active environmental sensitive electronic display device or a passive environmental sensitive electronic display device, wherein the active environmental sensitive electronic display device is, for example, an active-matrix organic light-emitting diode (AM-OLED), an active-matrix electro-phoretic display (AM-EPD) commonly known as electronic paper, an active-matrix liquid crystal display (AM-LCD), or an active-matrix blue phase liquid crystal display. The passive environmental sensitive electronic display device is, for example, a passive-matrix OLED (PM-OLED) or a super twisted nematic liquid crystal display (STN-LCD).

In addition, the first filler layer 240 is formed by, for example, UV light curing or thermal curing an adhesive material. The material of the adhesive material is, for example, acrylic resin or epoxy resin. In the present exemplary embodiment, before curing, the first filler layer 240 is in the form of, for example, a liquid type adhesive material or a sheet type adhesive material. Further, the first filler layer 240 further includes the heat conductive material 10, wherein the heat conductive material 10 is, for example, artificial diamond, diamond-like compound and diamond-like carbon, and is distributed throughout the first filler layer 240 in the form of nano-sized particles, which effectively enhances the heat conduction efficiency.

Following the above, the third substrate 250 is, for example, a metal substrate, and the third substrate 250 may be a flexible metal substrate having better heat conduction and heat dissipation properties. Of course, the third substrate 250 may also be a flexible substrate identical or similar to the first substrate 210, wherein the material of the flexible substrate may be polyethylene terephthalate (PET), polyethylene naphthalate (PEN), polyethersulfone (PES), polym-ethyl methacrylate (PMMA), polycarbonate (PC) or polyimide (PI). The disclosure is not limited hereto.

In addition, as shown in FIG. 3A, in the present exemplary embodiment, the side wall barrier structure SWB1 is located on the third substrate 250 and extends toward the first substrate 210, wherein a cross-section of the side wall barrier structure SWB1 perpendicular to the first substrate 210 is, for example, in a shape of trapezoid. This cross-section may also be in a shape of rectangle, other different types of polygons, circle or ellipse. The material of the side wall barrier structure SWB1 includes metal material, and the metal material is, for example, metal such as iron, aluminum, copper, magnesium, chromium, gold, silver, molybdenum and titanium, or alloy material thereof. The side wall barrier structure SWB1 is formed on the third substrate 250 by processes such as photolithography and etching, imprinting, or precision lathing. The side wall barrier structure SWB1 and the third substrate 250 may comprise the same or different material. The disclosure is not limited hereto.

As shown in FIG. 3B, in the present exemplary embodiment, the side wall barrier structure SWB1 is, for example, a closed structure that surrounds the environmental sensitive electronic device 230 and is configured to block water vapor and oxygen from the outside, wherein the side wall barrier structure SWB1 surrounds the thermal protrusion 260. The thermal protrusion 260 is formed on the third substrate 250 by, for example, processes such as photolithography and etching, imprinting, sandblasting or precision lathing, and is arranged in array, wherein the material of the thermal protrusion 260 may mainly include metal material or other high heat conductive material. The metal material is, for example, metal such as iron, aluminum, copper, magnesium, chromium, gold, silver, molybdenum and titanium, or alloy material thereof, or a stack of multiple layers of metal such as molybdenum/aluminum/molybdenum or titanium/aluminum/titanium, or inorganic material, or a mixture of organic and inorganic material, such as silicide, aluminide, diamond and diamond-like compound. The thermal protrusion 260 and the third substrate 250 may comprise the same or different material.

As shown in FIGS. 3A and 3B, in the present exemplary embodiment, the number of the thermal protrusion 260 is, for example, plural, and the thermal protrusions 260 are arranged in array in an area C on the third substrate 250, wherein the area C is roughly as large as the size of the environmental sensitive electronic device 230. Of course, the area of the area C may be adjusted depending on product design requirements. In other words, the area of the area C may be equal to, larger than or smaller than the size of the environmental sensitive electronic device 230. Accordingly, heat energy generated from the environmental sensitive electronic device 230 is transmitted to the thermal protrusion 260 via the second filler layer 270, and afterwards, transmitted from the thermal protrusion 260 to the third substrate 250 to be diffused outside.

The thermal protrusion of the disclosure effectively enhances efficiency of heat conduction and heat dissipation. In addition, in the present exemplary embodiment, a base area of the thermal protrusion 260 is, for example, in a shape of circle. In other exemplary embodiments that are not illustrated, the base area of the thermal protrusion 260 may be in a shape of triangle, square, rectangle, other different types of polygons, or ellipse. The disclosure is not limited hereto.

The second filler layer 270 is formed by, for example, UV light curing or thermal curing an adhesive material. The material of the adhesive material is, for example, acrylic resin or epoxy resin. In the present exemplary embodiment, before curing, the second filler layer 270 is in the form of, for example, a liquid type adhesive material or a sheet type adhesive material. The second filler layer 270 further includes the heat conductive material 10, wherein the heat conductive material 10 is, for example, artificial diamond, diamond-like compound and diamond-like carbon, and is distributed throughout the second filler layer 270 in the form of nano-sized particles, which effectively enhances the efficiency of heat conduction and heat dissipation.

In addition, the environmental sensitive electronic device package 200A of the present exemplary embodiment further includes a conductive wire DC, wherein the conductive wire DC is disposed on the first substrate 210 and located between the first substrate 210 and the second substrate 220. The conductive wire DC is electrically connected to the environmental sensitive electronic device 230, wherein the conductive wire DC is configured to receive an input signal and convert the input signal to produce an output signal, wherein the output signal is, for example, a display control signal. The conductive wire DC outputs the display control signal to control the environmental sensitive electronic device 230.

Figure 4A:
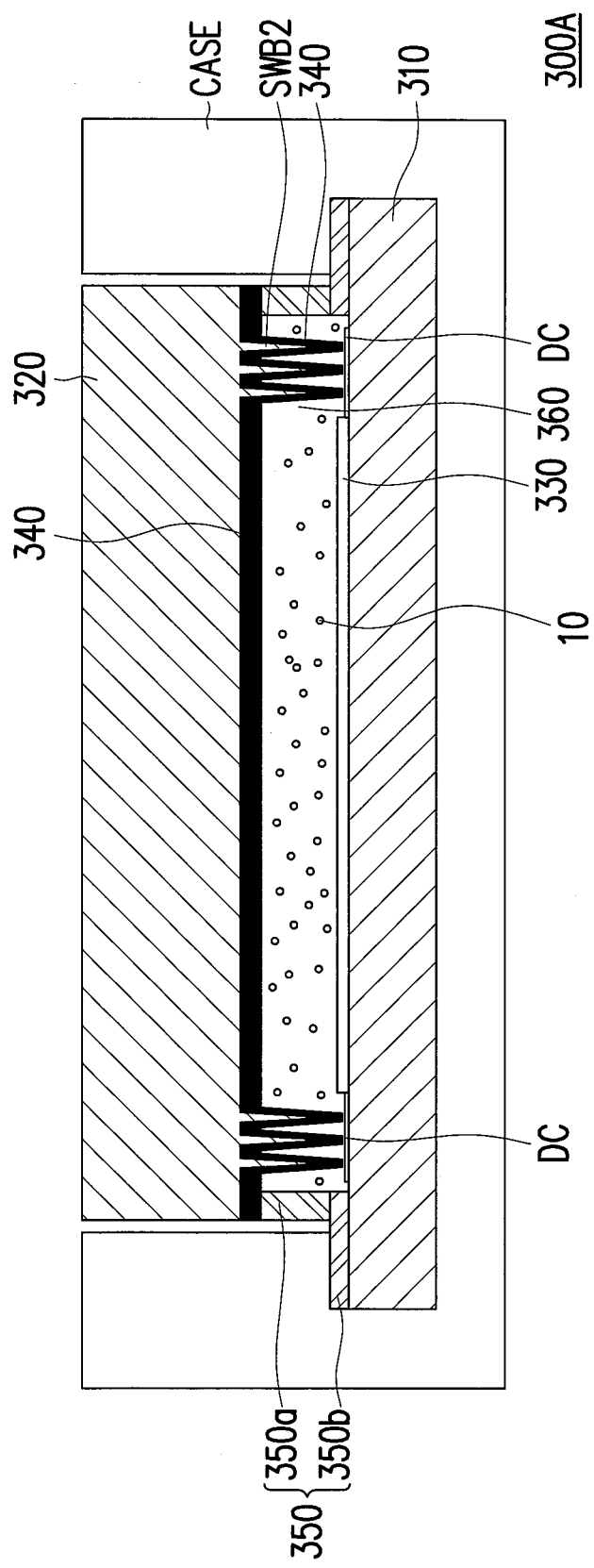
FIG. 4A is a schematic cross-sectional view illustrating an environmental sensitive electronic device package according to still another exemplary embodiment.
Figure 4B:
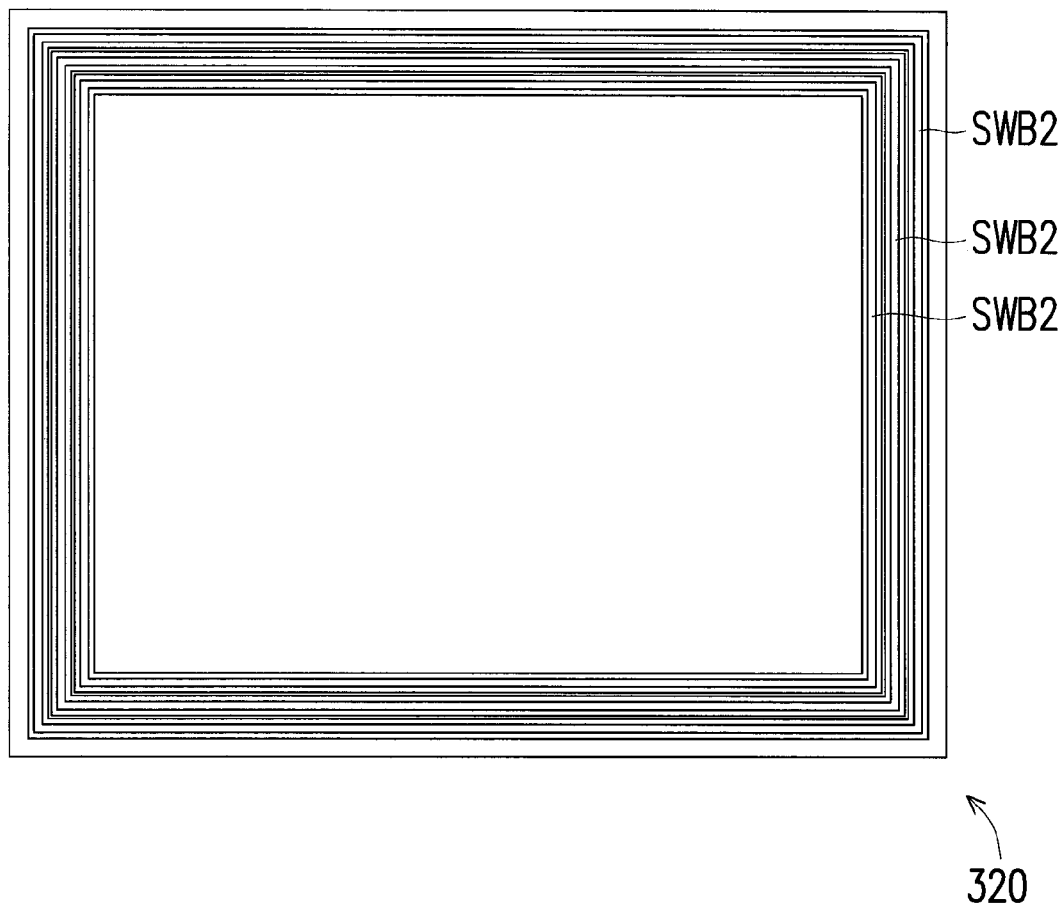
FIG. 4B is a bottom view of the environmental sensitive electronic device package in FIG. 4A.
Figure 4C:
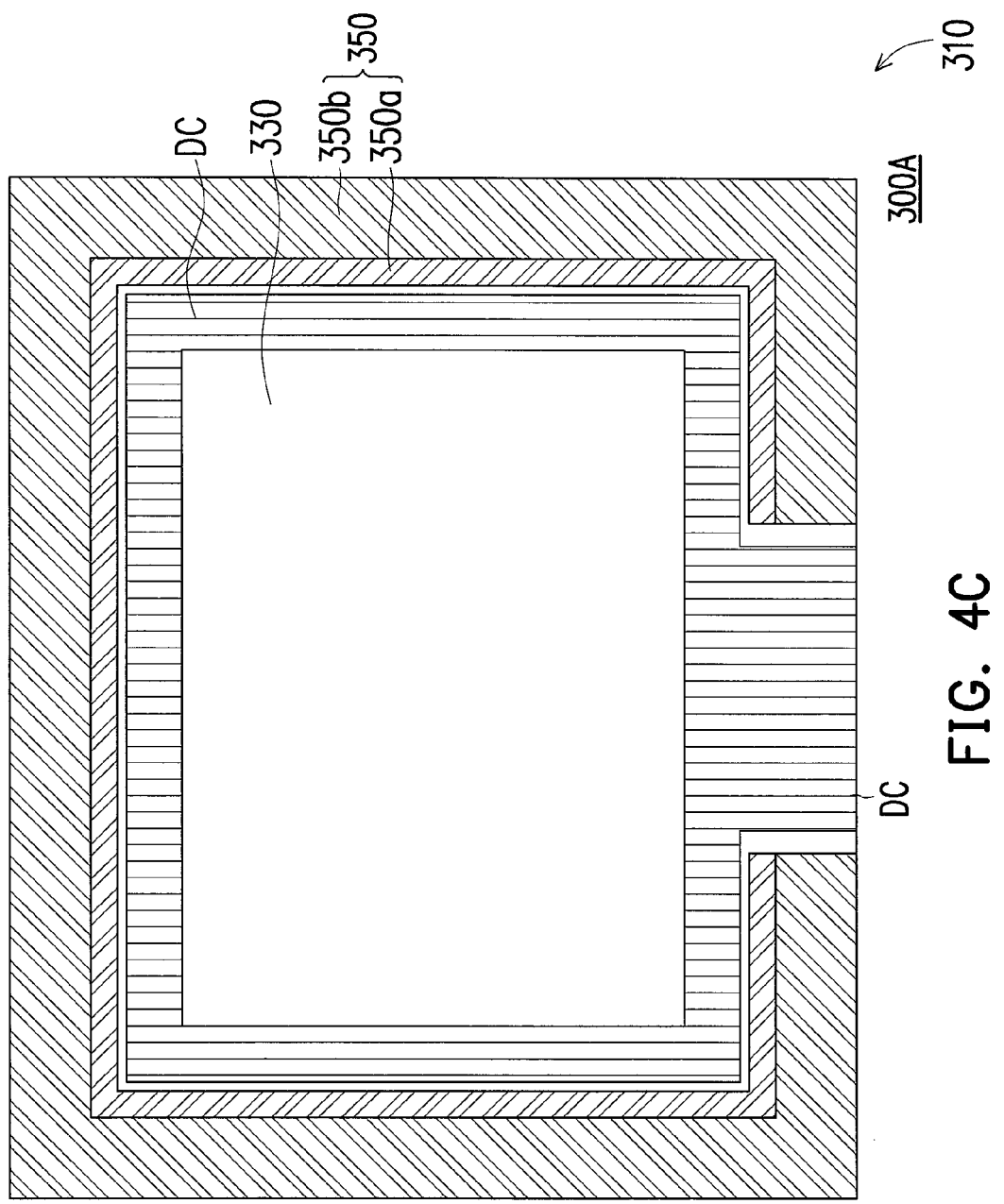
FIG. 4C is a top view of a third substrate of the environmental sensitive electronic device package in FIG. 4A.
Figure 4D:
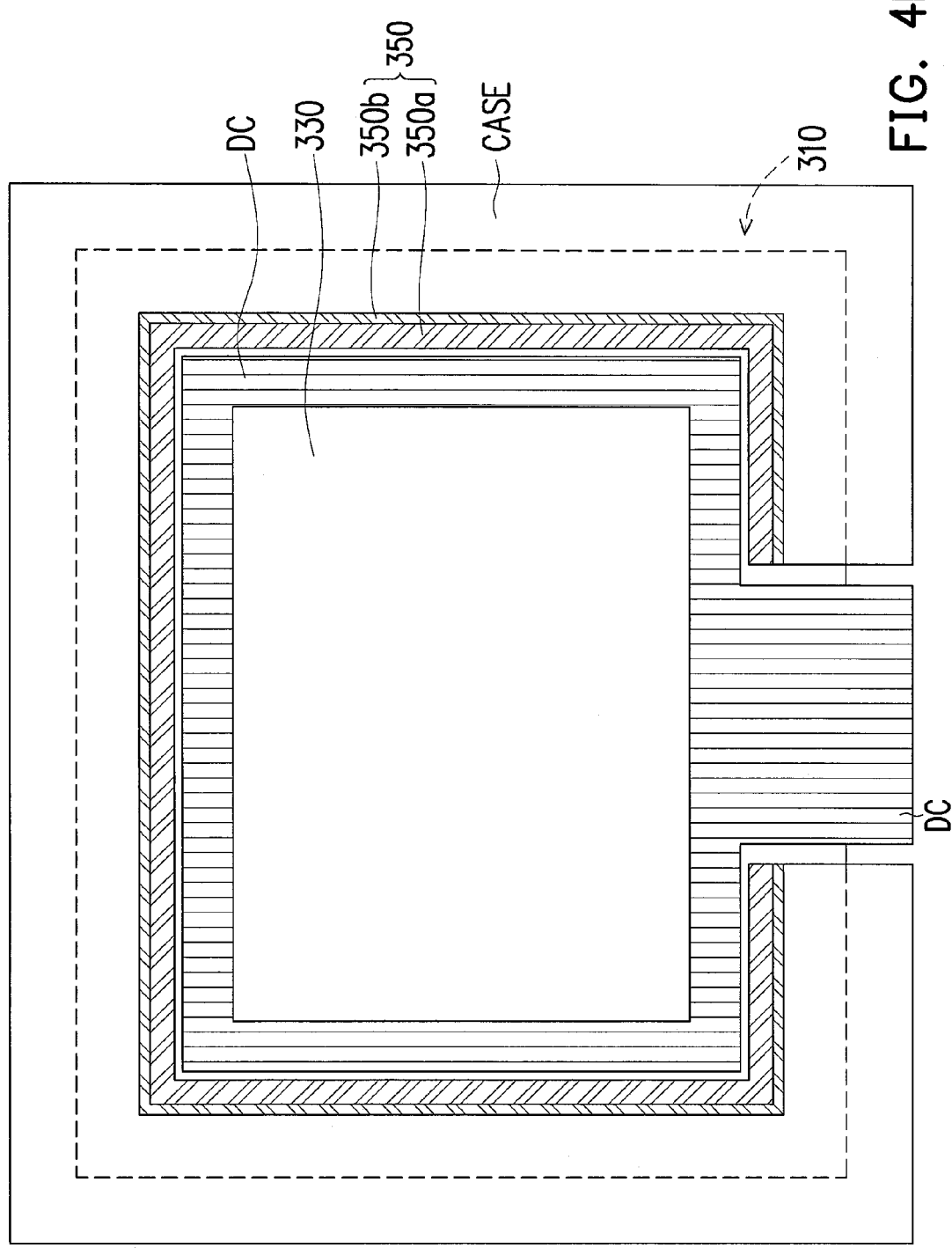
FIG. 4D is a schematic top view of engagement between the third substrate in FIG. 4C and a case.
Figure 4E:
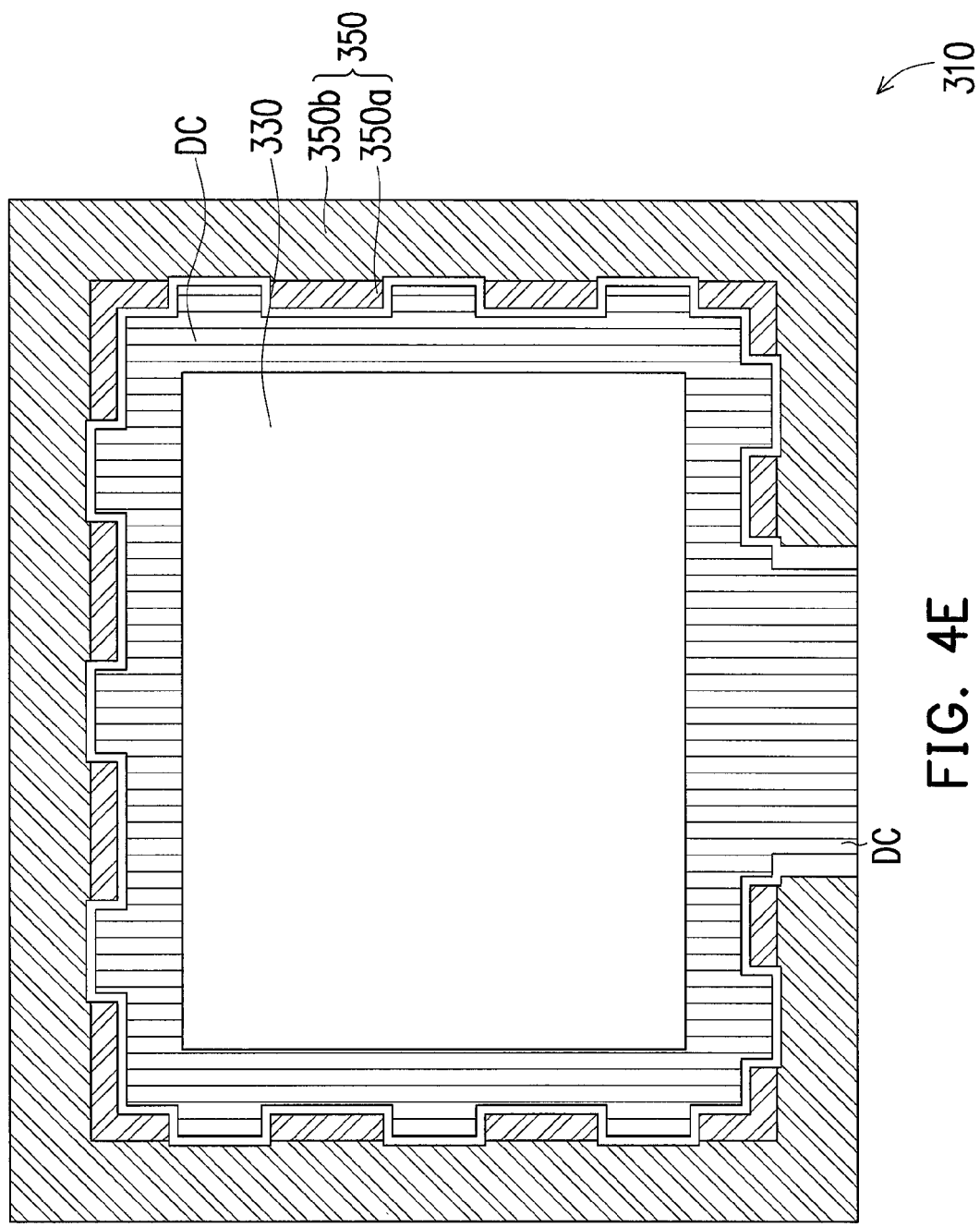
FIG. 4E is another top view of the third substrate of the environmental sensitive electronic device package in FIG. 4A.
Figure 4F:
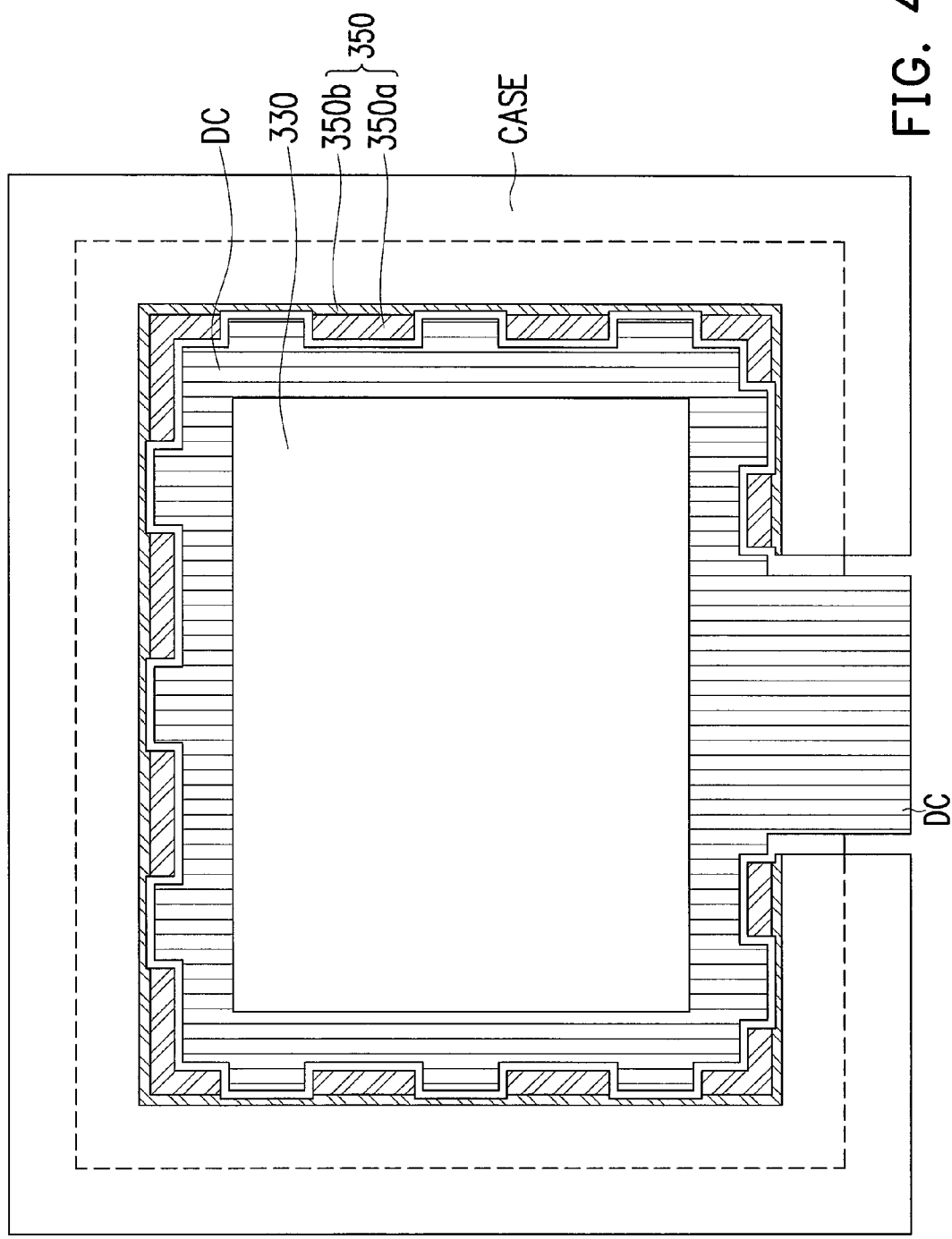
FIG. 4F is a schematic top view of engagement between the third substrate in FIG. 4E and a case.

FIG. 4A is a schematic cross-sectional view illustrating an environmental sensitive electronic device package according to still another exemplary embodiment. FIG. 4B is a bottom view of the environmental sensitive electronic device package in FIG. 4A. FIG. 4C is a top view of a third substrate of the environmental sensitive electronic device package in FIG. 4A. FIG. 4D is a schematic top view of engagement between the third substrate in FIG. 4C and a case. FIG. 4E is another top view of the third substrate of the environmental sensitive electronic device package in FIG. 4A. FIG. 4F is a schematic top view of engagement between the third substrate in FIG. 4E and a case. Referring to FIG. 4A, an environmental sensitive electronic device package 300A includes a first substrate 310, a second substrate 320, an environmental sensitive electronic device 330, at least one first side wall barrier structure SWB2, a first thermal layer 340, a first thermal structure 350 and a first filler layer 360. The second substrate 320 is disposed above the first substrate 310. The environmental sensitive electronic device 330 is disposed on the first substrate 310 and located between the first substrate 310 and the second substrate 320. The first side wall barrier structure SWB2 is disposed on the second substrate 320 and located between the first substrate 310 and the second substrate 320, wherein the first side wall barrier structure SWB2 is located on at least one side of the environmental sensitive electronic device 330. The first thermal layer 340 is disposed on the second substrate 320 and located between the first substrate 310 and the second substrate 320, wherein the first thermal layer 340 covers the second substrate 320 and the first side wall barrier structure SWB2. The first thermal structure 350 is disposed on the first substrate 310 and located between the first substrate 310 and the second substrate 320, wherein the first thermal structure 350 surrounds the first side wall barrier structure SWB2. The first filler layer 360 is located between the first substrate 310 and the second substrate 320 and covers the first side wall barrier structure SWB2 and the environmental sensitive electronic device 330, wherein the first thermal structure 350 is directly engaged with the first thermal layer 340 on the second substrate 320.

The first thermal structure 350 is further engaged with a case CASE of the environmental sensitive electronic device package 300A. In other words, heat energy generated from the environmental sensitive electronic device 330 is transmitted to the first thermal structure 350 via the first thermal layer 340, then transmitted from the first thermal structure 350 to the case CASE of the environmental sensitive electronic device package 300A, and is finally transmitted outward from the case CASE.

In the present exemplary embodiment, the first substrate 310 and the second substrate 320 are, for example, flexible substrates, wherein the material of the flexible substrates may be polyethylene terephthalate (PET), polyethylene naphthalate (PEN), polyethersulfone (PES), polymethyl methacrylate (PMMA), polycarbonate (PC), polyimide (PI) or metal foil. The environmental sensitive electronic device package 300A may further include a functional film (not illustrated), wherein the functional film is, for example, disposed on the second substrate 320 and located between the first substrate 310 and the second substrate 320. The functional film may be a touch panel, and the touch panel is, for example, a surface capacitive touch panel, a digital matrix touch panel (such as a projected capacitive touch panel) or an analog matrix touch panel. The functional film may also be a color filter or an electro-phoretic display (EPD). In one embodiment, the environmental sensitive electronic device package of the disclosure has a touch sensing function.

The environmental sensitive electronic device 330 is, for example, an active environmental sensitive electronic display device or a passive environmental sensitive electronic display device, wherein the active environmental sensitive electronic display device is, for example, an active-matrix organic light-emitting diode (AM-OLED), an active-matrix electro-phoretic display (AM-EPD) commonly known as electronic paper, an active-matrix liquid crystal display (AM-LCD), or an active-matrix blue phase liquid crystal display. The passive environmental sensitive electronic display device is, for example, a passive-matrix OLED (PM-OLED) or a super twisted nematic liquid crystal display (STN-LCD).

As shown in FIG. 4A, in the present exemplary embodiment, the first side wall barrier structure SWB2 is located on the second substrate 320 and extends toward the first substrate 310, wherein a cross-section of the first side wall barrier structure SWB2 perpendicular to the first substrate 310 is, for example, in a shape of trapezoid. This cross-section may also be in a shape of rectangle, other different types of polygons, circle or ellipse. The material of the first side wall barrier structure SWB2 includes metal material, and the metal material is, for example, metal such as iron, aluminum, copper, magnesium, chromium, gold, silver, molybdenum and titanium, or alloy material thereof. Moreover, the first side wall barrier structure SWB2 is formed on the second substrate 320 by processes such as photolithography and etching, imprinting, or precision lathing. The first side wall barrier structure SWB2 and the second substrate 320 may comprise the same or different material. The disclosure is not limited hereto.

Please refer to FIG. 4B. In order to clearly show the main characteristics of the first side wall barrier structure SWB2, the first thermal layer 340 that covers the second substrate 320 and the first side wall barrier structure SWB2 is not illustrated. The first side wall barrier structure SWB2 of the present exemplary embodiment is, for example, a closed structure that surrounds the environmental sensitive electronic device 330 and is configured to block water vapor and oxygen from the outside. In detail, in the present exemplary embodiment, the first thermal layer 340 that covers the first side wall barrier structure SWB2 mainly comprise the heat conductive material 10, wherein the heat conductive material 10 is, for example, artificial diamond, diamond-like compound and diamond-like carbon, and the first thermal layer 340 is, for example, formed on the first side wall barrier structure SWB2 from the heat conductive material 10 by processes such as chemical vapor deposition and spray coating. The first thermal layer 340 may also contain anti-electromagnetic interference (anti-EMI) material. The anti-electromagnetic interference material is, for example, gold, silver, copper, carbon or lead, which is configured to reduce electromagnetic effects.

The first thermal layer 340 that covers the first side wall barrier structure SWB2 may also comprise a metal material or high heat conductive material, wherein the metal material or high heat conductive material is, for example, a single layer of metal such as aluminum, molybdenum, titanium, or a stack of multiple layers of metal such as molybdenum/aluminum/molybdenum or titanium/aluminum/titanium. In general, the first thermal layer 340 is formed on the first side wall barrier structure SWB2 from the aforementioned metal material or high heat conductive material by processes such as chemical vapor deposition, film deposition and film sputter deposition.

As shown in FIG. 4C to FIG. 4F, the first thermal structure 350 may be a closed structure or a structure including a plurality of separated patterns, and the first thermal structure 350 surrounds the environmental sensitive electronic device 330, and has a design for avoiding the conductive wire DC, wherein the first thermal structure 350 is directly engaged with the first thermal layer 340. The first thermal structure 350 is further engaged with the case CASE of the environmental sensitive electronic device package 300A. The heat energy generated from the environmental sensitive electronic device 330 is transmitted to the first thermal structure 350 via the first thermal layer 340, then transmitted from the first thermal structure 350 to the case CASE of the environmental sensitive electronic device package 300A, and is finally transmitted outward from the case CASE.

As shown in FIG. 4A, the first thermal structure 350 includes a first heat conductive material 350a and a first heat conductive point 350b, wherein the material of the first heat conductive material 350a may mainly include metal material or other high heat conductive material such as heat conductive metal adhesive material and heat conductive tape. Material of the first heat conductive point 350b may mainly include metal material, wherein the metal material is, for example, a single layer of metal such as aluminum, molybdenum, titanium, or a stack of multiple layers of metal such as molybdenum/aluminum/molybdenum or titanium/aluminum/titanium. The first thermal structure 350 is formed on the first substrate 310 by processes such as chemical vapor deposition, film deposition and film sputter deposition. Further in detail, the first heat conductive point 350b is manufactured at the same time in a metal wire manufacturing process in an active component (e.g. Thin film transistor (TFT)) manufacturing process. The first heat conductive material 350a and the first heat conductive point 350b may comprise the same or different material. The disclosure is not limited hereto.

In the present exemplary embodiment, the first filler layer 360 is formed by, for example, UV light curing or thermal curing an adhesive material. The material of the adhesive material is, for example, acrylic resin or epoxy resin, wherein before curing, the first filler layer 360 is in the form of, for example, a liquid type adhesive material or a sheet type adhesive material. Further, the first filler layer 360 further includes the heat conductive material 10, wherein the heat conductive material 10 is, for example, artificial diamond, diamond-like compound and diamond-like carbon, and is distributed throughout the first filler layer 360 in the form of nano-sized particles, which effectively enhances the heat conduction efficiency.

As shown in FIG. 4A, in the present exemplary embodiment, the first substrate 310 and the second substrate 320 are installed in the case CASE, and the second substrate 320 is disposed on the case CASE. Material of the case CASE may mainly include metal material or other high heat conductive material, wherein the case CASE is in contact with the first thermal structure 350. The heat energy generated from the environmental sensitive electronic device 330 is transmitted to the first thermal layer 340 via the first filler layer 360, wherein the first thermal layer 340 is connected with the first thermal structure 350. The heat energy is further transmitted from the first thermal structure 350 to the case CASE to be guided out of the environmental sensitive electronic device 330, thereby reducing influence of the heat energy on life of the environmental sensitive electronic device 330.

In the present exemplary embodiment, the environmental sensitive electronic device package 300A has, for example, a top emission design or a bottom emission design. In other exemplary embodiments that are not illustrated, the case CASE of the environmental sensitive electronic device package 300A may be further designed to have dual-sided light-emitting openings so that light is emitted from a top surface and a bottom surface at the same time, thereby achieving dual emission.

Other exemplary embodiments are given below to describe the designs of environmental sensitive electronic device packages 300B and 300C, wherein the same or similar elements are denoted by the same or similar reference numbers, and the same or similar elements have the same or similar characteristics, and thus details will not be repeated herein.

Figure 5A:
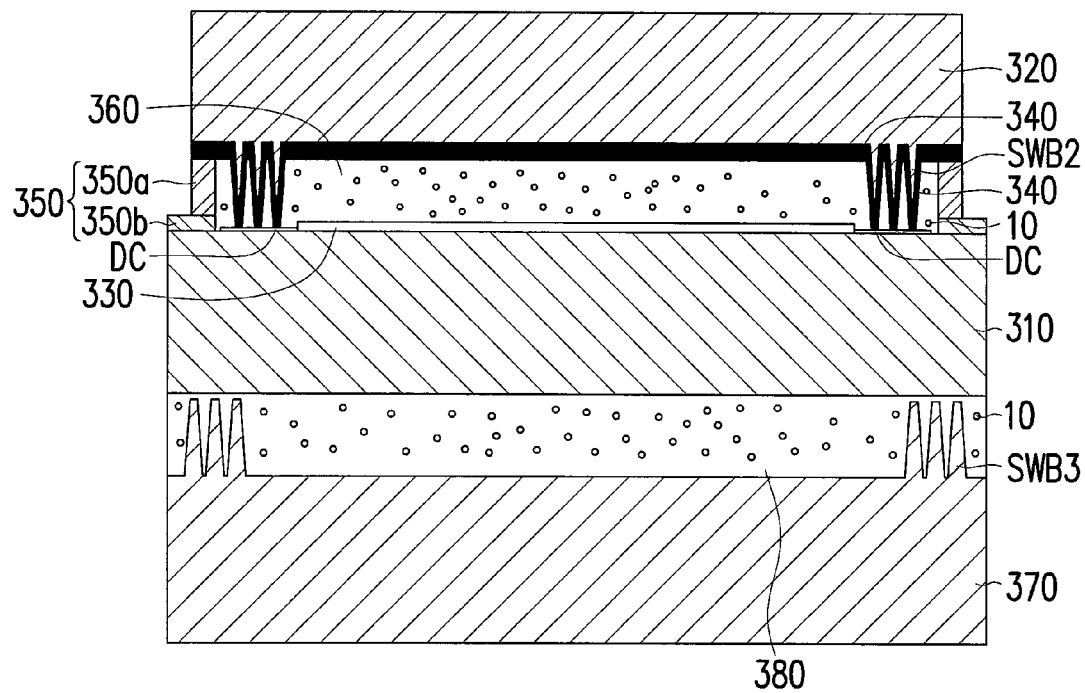
FIG. 5A illustrates an environmental sensitive electronic device package according to still another exemplary embodiment.
Figure 5B:
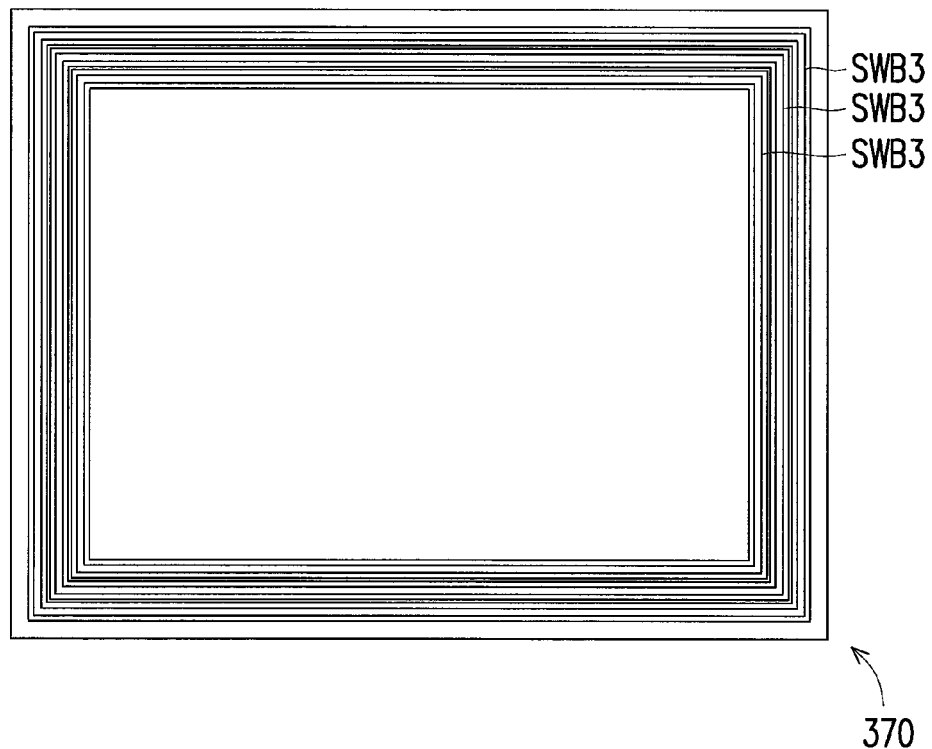
FIG. 5B is a top view of a third substrate of the environmental sensitive electronic device package in FIG. 5A.

FIG. 5A illustrates an environmental sensitive electronic device package according to still another exemplary embodiment. FIG. 5B is a top view of a third substrate of the environmental sensitive electronic device package in FIG. 5A. As shown in FIG. 5A, the environmental sensitive electronic device package 300B in FIG. 5A is similar to the environmental sensitive electronic device package 300A in FIG. 4A, and the main difference therebetween lies in that the environmental sensitive electronic device package 300B in FIG. 5A does not have the case CASE, wherein the environmental sensitive electronic device package 300B further includes a third substrate 370, a second side wall barrier structure SWB3 and a second filler layer 380. The third substrate 370 is disposed below the first substrate 310, wherein the first substrate 310 is located between the second substrate 320 and the third substrate 370. The second side wall barrier structure SWB3 is disposed on the third substrate 370 and located between the first substrate 310 and the third substrate 370. The second filler layer 380 is located between the first substrate 310 and the third substrate 370, wherein the second filler layer 380 covers the second side wall barrier structure SWB3, and the third substrate 370 is attached to the first substrate 310 via the second filler layer 380.

In the present exemplary embodiment, the third substrate 370 is, for example, a metal substrate, and the third substrate 370 may be a flexible metal substrate having better heat conduction and heat dissipation properties. The third substrate 370 may also be a flexible substrate identical or similar to the first substrate 310, wherein the material of the flexible substrate may be polyethylene terephthalate (PET), polyethylene naphthalate (PEN), polyethersulfone (PES), polymethyl methacrylate (PMMA), polycarbonate (PC) or polyimide (PI). The disclosure is not limited hereto.

The second side wall barrier structure SWB3 is located on the third substrate 370 and extends toward the first substrate 310, wherein a cross-section of the second side wall barrier structure SWB3 perpendicular to the first substrate 310 is, for example, in a shape of trapezoid. This cross-section may also be in a shape of rectangle, other different types of polygons, circle or ellipse. The material of the second side wall barrier structure SWB3 includes metal material, and the metal material is, for example, metal such as iron, aluminum, copper, magnesium, chromium, gold, silver, molybdenum and titanium, or alloy material thereof. Moreover, the second side wall barrier structure SWB3 is formed on the third substrate 370 by processes such as photolithography and etching, imprinting, or precision lathing. The second side wall barrier structure SWB3 and the third substrate 370 may comprise the same or different material. The disclosure is not limited hereto.

The second filler layer 380 is formed by, for example, UV light curing or thermal curing an adhesive material. The material of the adhesive material is, for example, acrylic resin or epoxy resin. In the present exemplary embodiment, before curing, the second filler layer 380 is in the form of, for example, a liquid type adhesive material or a sheet type adhesive material. The second filler layer 380 further includes the heat conductive material 10, wherein the heat conductive material 10 is, for example, artificial diamond, diamond-like compound and diamond-like carbon, and is distributed throughout the second filler layer 380 in the form of nano-sized particles, which effectively enhances the heat conduction efficiency. The heat energy generated from the environmental sensitive electronic device 330 is transmitted to the second filler layer 380 via the first substrate 310, and then transmitted from the second filler layer 380 to the second side wall barrier structure SWB3 and the third substrate 370 to be diffused outside. Alternatively, it may be transmitted to the first thermal structure 350 via the first thermal layer 340 to be guided out.

As shown in FIG. 5B, in the present exemplary embodiment, the second side wall barrier structure SWB3 is, for example, a closed structure that surrounds the environmental sensitive electronic device and is configured to block water vapor and oxygen from the outside.

Figure 6:
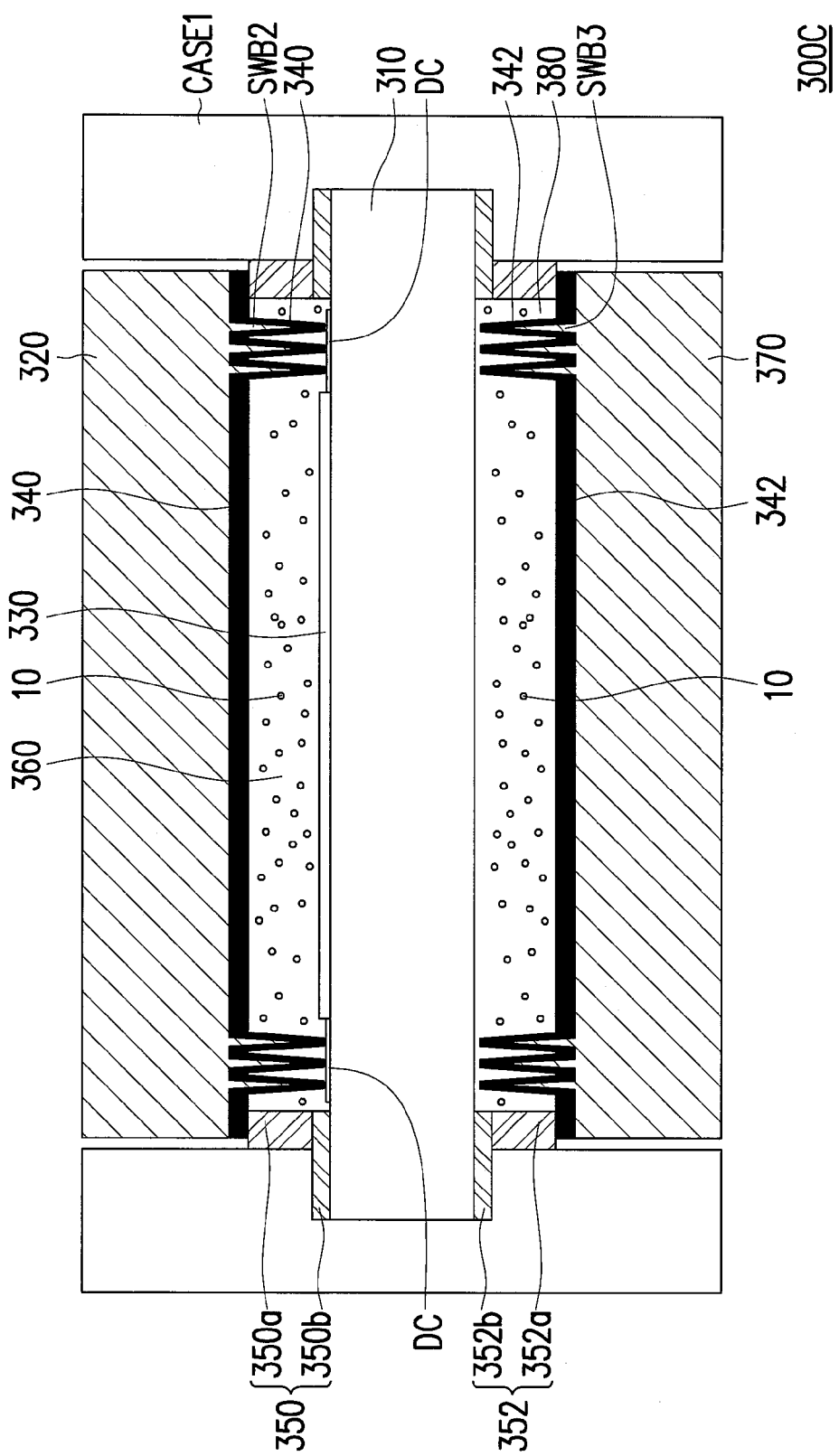
FIG. 6 illustrates an environmental sensitive electronic device package according to still another exemplary embodiment.

FIG. 6 illustrates an environmental sensitive electronic device package according to still another exemplary embodiment. As shown in FIG. 6, the environmental sensitive electronic device package 300C in FIG. 6 is similar to the environmental sensitive electronic device package 300B in FIG. 5A, and the main difference therebetween lies in that the environmental sensitive electronic device package 300C in FIG. 6 further includes a second thermal layer 342, a second thermal structure 352 and a case CASE1. The second thermal layer 342 is disposed on the third substrate 370 and located between the first substrate 310 and the third substrate 370, wherein the second thermal layer 342 covers the third substrate 370 and the second side wall barrier structure SWB3. The second thermal structure 352 is disposed on the first substrate 310 and located between the first substrate 310 and the third substrate 370, wherein the second thermal structure 352 surrounds the second side wall barrier structure SWB3, and the second thermal structure 352 is engaged with the second thermal layer 342 on the first substrate 310. The first substrate 310, second substrate 320 and third substrate 370 are installed in the case CASE1.

In the present exemplary embodiment, the second thermal layer 342 that covers the second side wall barrier structure SWB3 may mainly comprise the heat conductive material 10, wherein the heat conductive material 10 is, for example, artificial diamond, diamond-like compound and diamond-like carbon, and the second thermal layer 342 is, for example, formed on the second side wall barrier structure SWB3 from the heat conductive material 10 by processes such as chemical vapor deposition and spray coating. The second thermal layer 342 may also contain anti-electromagnetic interference material. The anti-electromagnetic interference material is, for example, gold, silver, copper, carbon or lead, which is configured to reduce electromagnetic effects.

The second thermal layer 342 that covers the second side wall barrier structure SWB3 may also comprise metal material or high heat conductive material, wherein the metal material or high heat conductive material is, for example, a single layer of metal such as aluminum, molybdenum, titanium, or a stack of multiple layers of metal such as molybdenum/aluminum/molybdenum or titanium/aluminum/titanium. The second thermal layer 342 is formed on the second side wall barrier structure SWB3 from the aforementioned metal material or high heat conductive material by processes such as chemical vapor deposition, film deposition and film sputter deposition.

The second thermal structure 352 may be a closed structure or a structure including a plurality of separated patterns. The second thermal structure 352 surrounds the environmental sensitive electronic device 330, and has a design for avoiding the conductive wire DC, wherein the second thermal structure 352 is directly engaged with the second thermal layer 342. In other words, the second thermal structure 352 is roughly identical or similar to the structure depicted in FIG. 4A to 4E. The second thermal structure 352 is further engaged with the case CASE1 of the environmental sensitive electronic device package 300C. Heat energy generateded from the environmental sensitive electronic device 330 is transmitted to the second thermal structure 352 via the second thermal layer 342, then transmitted from the second thermal structure 352 to the case CASE1 of the environmental sensitive electronic device package 300C, and is finally transmitted outward via the case CASE1.

As shown in FIG. 6, the second thermal structure 352 includes a second heat conductive material 352a and a second heat conductive point 352b, wherein the material of the second heat conductive material 352a may mainly include metal material or other high heat conductive material such as heat conductive metal adhesive material and heat conductive tape. The material of the second heat conductive point 352b may mainly include metal material, wherein the metal material is, for example, a single layer of metal such as aluminum, molybdenum, titanium, or a stack of multiple layers of metal such as molybdenum/aluminum/molybdenum or titanium/aluminum/titanium. The second thermal structure 352 is formed on the first substrate 310 by processes such as chemical vapor deposition, film deposition and film sputter deposition. The second heat conductive point 352b may be manufactured at the same time in a metal wire manufacturing process in an active component (e.g. Thin film transistor (TFT)) manufacturing process. Moreover, the second heat conductive material 352a and the second heat conductive point 352b may comprise the same or different material. The disclosure is not limited hereto.

In the present exemplary embodiment, the first substrate 310, second substrate 320 and third substrate 370 are, for example, surrounded by the case CASE1, wherein the first substrate 310 further abuts against an inner surface of the case CASE1, and the case CASE1 is in contact with the first thermal structure 350 and the second thermal structure 352. In other words, the heat energy generated from the environmental sensitive electronic device 330 is transmitted to the first thermal layer 340 via the first filler layer 360, wherein the first thermal layer 340 is connected with the first thermal structure 350. The heat energy is further transmitted from the first thermal structure 350 to the case CASE1 to be guided out of the environmental sensitive electronic device 330, thereby reducing influence of the heat energy on life of the environmental sensitive electronic device 330.

The heat energy generated from the environmental sensitive electronic device 330 may also be transmitted to the second filler layer 380 via the first substrate 310, and further transmitted from the second filler layer 380 to the second thermal layer 342, wherein the second thermal layer 342 is connected with the second thermal structure 352. The heat energy is further transmitted from the second thermal structure 352 to the case CASE1 to be guided out. The heat energy may also be directly transmitted to the second thermal structure 352 via the first substrate 310, wherein the second thermal structure 352 abuts against the case CASE1. Thus, the heat energy is transmitted from the second thermal structure 352 to the case CASE1 to be guided out. The heat energy generated from the environmental sensitive electronic device 330 may be transmitted to the first substrate 310, and then transmitted from the first substrate 310 to the case CASE1 to be guided out.

In the present exemplary embodiment, the environmental sensitive electronic device package 300C has, for example, a dual emission design. That is, the case CASE1 of the environmental sensitive electronic device package 300C is further designed to have top and bottom light-emitting openings so that light is emitted from a top surface and a bottom surface at the same time, thereby achieving dual emission.

Figure 7A:
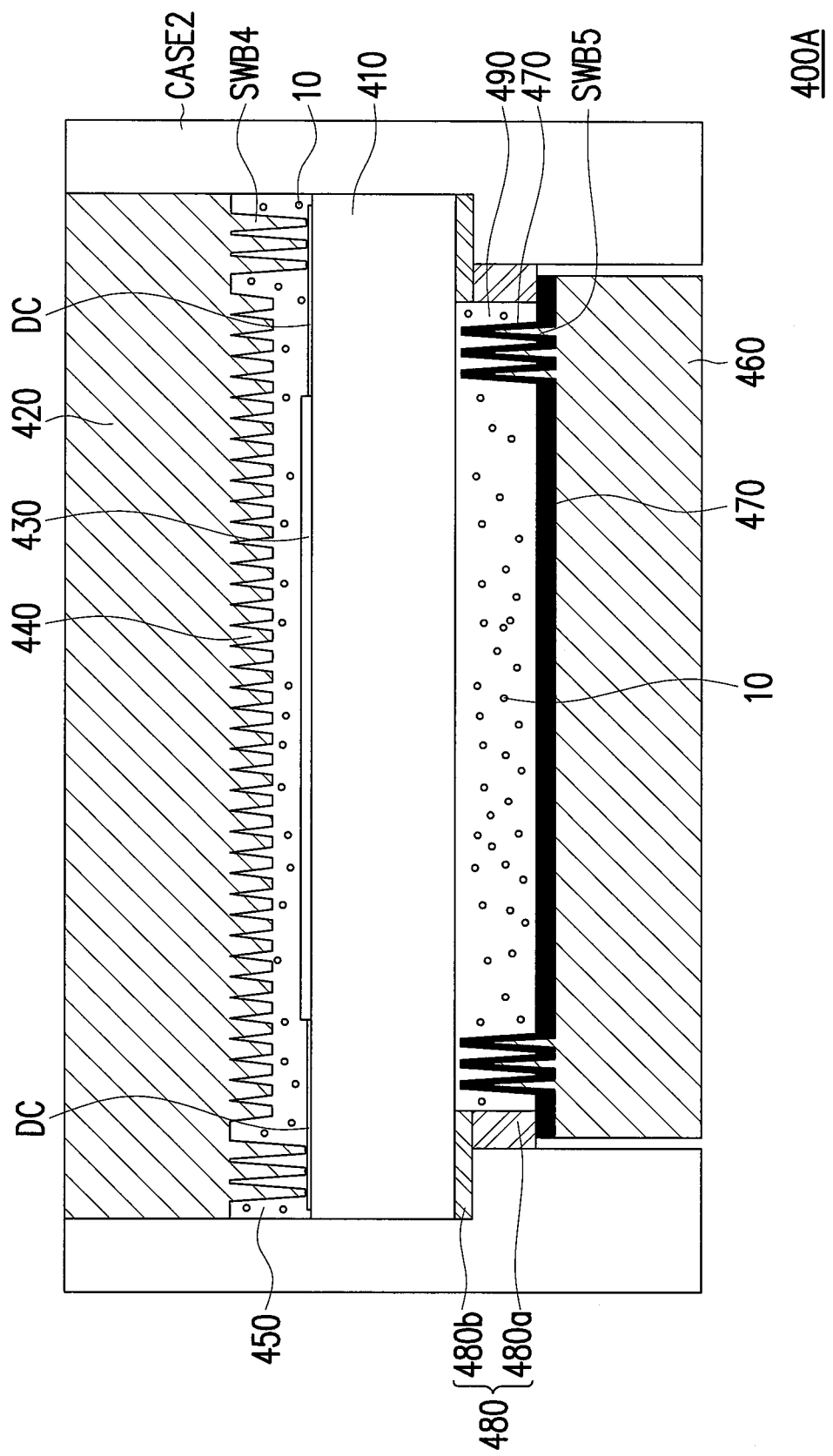
FIG. 7A illustrates an environmental sensitive electronic device package according to yet still another exemplary embodiment.
Figure 7B:
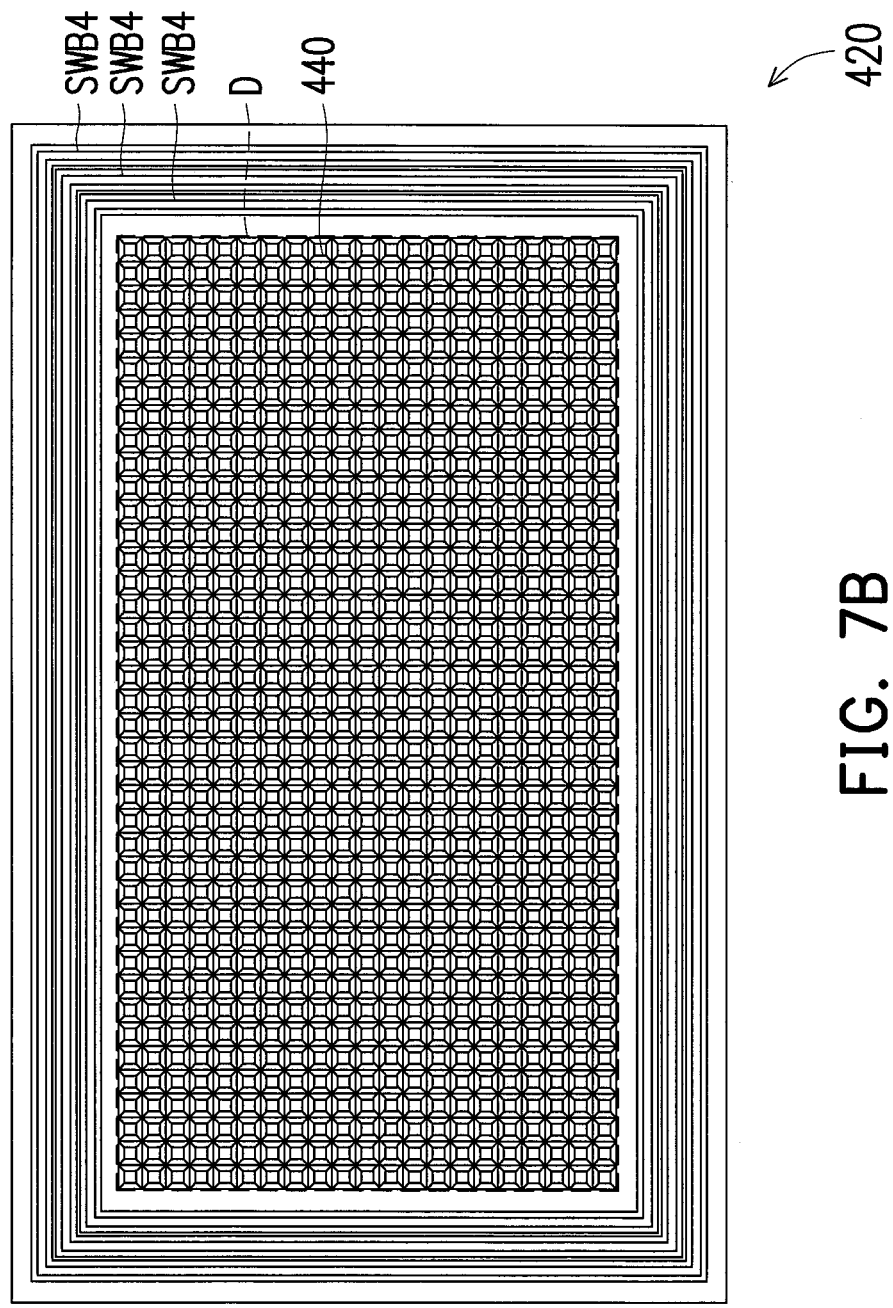
FIG. 7B is a top view of the environmental sensitive electronic device package in FIG. 7A.

FIG. 7A illustrates an environmental sensitive electronic device package according to yet still another exemplary embodiment. FIG. 7B is a top view of the environmental sensitive electronic device package in FIG. 7A. Referring to FIG. 7A, an environmental sensitive electronic device package 400A includes a first substrate 410, a second substrate 420, an environmental sensitive electronic device 430, at least one first side wall barrier structure SWB4, at least one thermal protrusion 440, a first filler layer 450, a third substrate 460, at least one second side wall barrier structure SWB5, a thermal layer 470, a thermal structure 480, and a second filler layer 490. The second substrate 420 is disposed above the first substrate 410. The environmental sensitive electronic device 430 is disposed on the first substrate 410 and located between the first substrate 410 and the second substrate 420. The first side wall barrier structure SWB4 is disposed on the second substrate 420 and located between the first substrate 410 and the second substrate 420, wherein the first side wall barrier structure SWB4 is located on at least one side of the environmental sensitive electronic device 430. The thermal protrusion 440 is located on the second substrate 420 and extends toward the first substrate 410. The first filler layer 450 is located between the first substrate 410 and the second substrate 420, and the first substrate 410 is attached to the second substrate 420 via the first filler layer 450, wherein the first filler layer 450 covers the environmental sensitive electronic device 430, the thermal protrusion 440 and the first side wall barrier structure SWB4. The third substrate 460 is disposed below the first substrate 410, wherein the first substrate 410 is located between the second substrate 420 and the third substrate 460. The second side wall barrier structure SWB5 is disposed on the third substrate 460 and located between the first substrate 410 and the third substrate 460. The thermal layer 470 is disposed on the third substrate 460 and located between the first substrate 410 and the third substrate 460, wherein the thermal layer 470 covers the third substrate 460 and the second side wall barrier structure SWB5. The thermal structure 480 is disposed on the first substrate 410 and located between the first substrate 410 and the third substrate 460, wherein the thermal structure 480 surrounds the second side wall barrier structure SWB5, and the thermal structure 480 is engaged with the thermal layer 470 on the third substrate 460. The second filler layer 490 is located between the first substrate 410 and the third substrate 460, and the first substrate 410 is attached to the third substrate 460 via the second filler layer 490, wherein the second filler layer 490 covers the second side wall barrier structure SWB5.

In the present exemplary embodiment, the first substrate 410 is, for example, a flexible glass film having both flexibility of a flexible substrate and properties of a hard substrate. The first substrate 410 may also be other types of flexible substrates, wherein the material of the flexible substrate may be polyethylene terephthalate (PET), polyethylene naphthalate (PEN), polyethersulfone (PES), polymethyl methacrylate (PMMA), polycarbonate (PC), polyimide (PI) or metal foil. The environmental sensitive electronic device package 400A may further include a functional film (not illustrated), wherein the functional film is, for example, disposed on the first substrate 410 and located between the first substrate 410 and the environmental sensitive electronic device 430. The functional film may be a touch panel, and the touch panel is, for example, a surface capacitive touch panel, a digital matrix touch panel (such as a projected capacitive touch panel) or an analog matrix touch panel. The functional film may also be a color filter or an electro-phoretic display (EPD). In one embodiment, the environmental sensitive electronic device package of the disclosure has a touch sensing function.

In the present exemplary embodiment, the second substrate 420 is, for example, a metal substrate, and the second substrate 420 may be a flexible metal substrate having better heat conduction and heat dissipation properties. The second substrate 420 may also be a flexible substrate identical or similar to the first substrate 410, wherein the material of the flexible substrate may be polyethylene terephthalate (PET), polyethylene naphthalate (PEN), polyethersulfone (PES), polymethyl methacrylate (PMMA), polycarbonate (PC) or polyimide (PI). The disclosure is not limited hereto.

The environmental sensitive electronic device 430 is, for example, an active environmental sensitive electronic display device or a passive environmental sensitive electronic display device, wherein the active environmental sensitive electronic display device is, for example, an active-matrix organic light-emitting diode (AM-OLED), an active-matrix electro-phoretic display (AM-EPD) commonly known as electronic paper, an active-matrix liquid crystal display (AM-LCD), or an active-matrix blue phase liquid crystal display. The passive environmental sensitive electronic display device is, for example, a passive-matrix OLED (PM-OLED) or a super twisted nematic liquid crystal display (STN-LCD).

As shown in FIG. 7A, in the present exemplary embodiment, the first side wall barrier structure SWB4 is located on the second substrate 420 and extends toward the first substrate 410, wherein a cross-section of the first side wall barrier structure SWB4 perpendicular to the first substrate 410 is, for example, in a shape of trapezoid. This cross-section may also be in a shape of rectangle, other different types of polygons, circle or ellipse. The material of the first side wall barrier structure SWB4 may include metal material, and the metal material is, for example, metal such as iron, aluminum, copper, magnesium, chromium, gold, silver, molybdenum and titanium, or alloy material thereof. Moreover, the first side wall barrier structure SWB4 is formed on the second substrate 420 by processes such as photolithography and etching, imprinting, or precision lathing. In the present exemplary embodiment, the first side wall barrier structure SWB4 and the second substrate 420, for example, comprise the same material. In other exemplary embodiments that are not illustrated, the first side wall barrier structure SWB4 and the second substrate 420 may comprise different materials. The disclosure is not limited hereto.

As shown in FIG. 7B, in the present exemplary embodiment, the first side wall barrier structure SWB4 is, for example, a closed structure that surrounds the environmental sensitive electronic device 430 and is configured to block water vapor and oxygen from the outside, wherein the first side wall barrier structure SWB4 surrounds the thermal protrusion 440. As shown in FIG. 7A, the thermal protrusion 440 and the second substrate 420 in the present exemplary embodiment, for example, comprise the same material, wherein the thermal protrusion 440 is formed on the second substrate 420 by, for example, processes such as photolithography and etching, imprinting, sandblasting or precision lathing, and is arranged in array. The materials of the second substrate 420 and the thermal protrusion 440 are mainly metal material, for example, metal such as iron, aluminum, copper, magnesium, chromium, gold, silver, molybdenum and titanium, or alloy material thereof.

In other exemplary embodiments that are not illustrated, the thermal protrusion 440 and the second substrate 420 may comprise different materials, wherein the material of the second substrate 420 is, for example, metal material, for example, metal such as iron, aluminum, copper, magnesium, chromium, gold, silver, molybdenum and titanium, or alloy material thereof. The material of the thermal protrusion 440 may be mainly inorganic material, such as silicide, aluminide, diamond and diamond-like compound. The thermal protrusion 440 is formed on the second substrate 420 by processes such as chemical vapor deposition, sputtering and spray coating and is arranged in array.

As shown in FIGS. 7A and 7B, in the present exemplary embodiment, the number of the thermal protrusion 440 is, for example, plural, and the thermal protrusions 440 are arranged in array in an area D on the second substrate 420, wherein the area D is roughly as large as the size of the environmental sensitive electronic device 430. The area of the area D may be adjusted depending on product design requirements. The area of the area D may be equal to, larger than or smaller than the size of the environmental sensitive electronic device 430. Accordingly, heat energy generated from the environmental sensitive electronic device 430 is transmitted to the thermal protrusion 440 via the first filler layer 450, and afterwards, transmitted from the thermal protrusion 440 to the second substrate 420 to be diffused outside.

The thermal protrusion of the disclosure effectively enhances efficiency of heat conduction and heat dissipation In the present exemplary embodiment, a base area of the thermal protrusion 440 is, for example, in a shape of square. In other exemplary embodiments that are not illustrated, the base area of the thermal protrusion 440 may be in a shape of triangle, other different types of polygons, circle or ellipse. The disclosure is not limited hereto.

The first filler layer 450 is formed by, for example, UV light curing or thermal curing an adhesive material. The material of the adhesive material is, for example, acrylic resin or epoxy resin. In the present exemplary embodiment, before curing, the first filler layer 450 is in the form of, for example, a liquid type adhesive material or a sheet type adhesive material. Further, the first filler layer 450 further includes the heat conductive material 10, wherein the heat conductive material 10 is, for example, artificial diamond, diamond-like compound and diamond-like carbon, and is distributed throughout the first filler layer 450 in the form of nano-sized particles, which effectively enhances the heat conduction efficiency.

The environmental sensitive electronic device package 400A of the present exemplary embodiment further includes a conductive wire DC, wherein the conductive wire DC is disposed on the first substrate 410 and located between the first substrate 410 and the second substrate 420. The conductive wire DC is electrically connected to the environmental sensitive electronic device 430, wherein the conductive wire DC is configured to receive an input signal and convert the input signal to produce an output signal, wherein the output signal is, for example, a display control signal. The conductive wire DC outputs the display control signal to control the environmental sensitive electronic device 430.

The third substrate 460 is, for example, a metal substrate, and the third substrate 460 may be a flexible metal substrate having better heat conduction and heat dissipation properties. The third substrate 460 may also be a flexible substrate identical or similar to the first substrate 410, wherein the material of the flexible substrate may be polyethylene terephthalate (PET), polyethylene naphthalate (PEN), polyethersulfone (PES), polymethyl methacrylate (PMMA), polycarbonate (PC) or polyimide (PI). The disclosure is not limited hereto.

As shown in FIG. 7A, in the present exemplary embodiment, the second side wall barrier structure SWB5 is located on the third substrate 460 and extends toward the first substrate 410, wherein a cross-section of the second side wall barrier structure SWB5 perpendicular to the first substrate 410 is, for example, in a shape of trapezoid. This cross-section may also be in a shape of rectangle, other different types of polygons, circle or ellipse. The material of the second side wall barrier structure SWB5 may include metal material, and the metal material is, for example, metal such as iron, aluminum, copper, magnesium, chromium, gold, silver, molybdenum and titanium, or alloy material thereof. Moreover, the second side wall barrier structure SWB5 is formed on the third substrate 460 by processes such as photolithography and etching, imprinting, or precision lathing. The second side wall barrier structure SWB5 and the third substrate 460 may comprise the same or different material. The disclosure is not limited hereto.

In the present exemplary embodiment, the thermal layer 470 that covers the second side wall barrier structure SWB5 may mainly comprise the heat conductive material 10, wherein the heat conductive material 10 is, for example, artificial diamond, diamond-like compound and diamond-like carbon, and the thermal layer 470 is, for example, formed on the second side wall barrier structure SWB5 from the heat conductive material 10 by processes such as chemical vapor deposition and spray coating. The thermal layer 470 may also contain anti-electromagnetic interference material. In general, the anti-electromagnetic interference material is, for example, gold, silver, copper, carbon or lead, which is configured to reduce electromagnetic effects.

The thermal layer 470 that covers the second side wall barrier structure SWB5 may also comprise metal material or high heat conductive material, wherein the metal material or high heat conductive material is, for example, a single layer of metal such as aluminum, molybdenum, titanium, or a stack of multiple layers of metal such as molybdenum/ aluminum/molybdenum or titanium/aluminum/titanium. The thermal layer 470 is formed on the second side wall barrier structure SWB5 from the aforementioned metal material or high heat conductive material by processes such as chemical vapor deposition, film deposition and film sputter deposition.

The thermal structure 480 is, for example, a closed structure that surrounds the environmental sensitive electronic device 430, wherein the thermal structure 480 may directly be engaged with the thermal layer 470. The thermal structure 480 is further engaged with a case CASE2. Accordingly, the heat energy generated from the environmental sensitive electronic device 430 is transmitted to the thermal structure 480 via the thermal layer 470, then transmitted from the thermal structure 480 to the case CASE2, and is finally transmitted outward from the case CASE2.

As shown in FIG. 7A, the thermal structure 480 may include a heat conductive material 480a and a heat conductive point 480b, wherein the material of the heat conductive material 480a may mainly include metal material or other high heat conductive material such as heat conductive metal adhesive material and heat conductive tape. The material of the heat conductive point 480b may mainly include metal material, wherein the metal material is, for example, a single layer of metal such as aluminum, molybdenum, titanium, or a stack of multiple layers of metal such as molybdenum/ aluminum/molybdenum or titanium/aluminum/titanium. The thermal structure 480 is formed on the first substrate 410 by processes such as chemical vapor deposition, film deposition and film sputter deposition. The heat conductive point 480b is manufactured at the same time in a metal wire manufacturing process in an active component (e.g. Thin film transistor (TFT)) manufacturing process. Moreover, the heat conductive material 480a and the heat conductive point 480b may comprise the same or different material. The disclosure is not limited hereto.

In the present exemplary embodiment, the first substrate 410, second substrate 420 and third substrate 460 are installed in the case CASE2. The first substrate 410, second substrate 420 and third substrate 460 are, for example, surrounded by the case CASE2, wherein the first substrate 410 further abuts against an inner surface of the case CASE2. The heat energy generated from the environmental sensitive electronic device 430 is transmitted via the first substrate 410 to the case CASE2 to be guided out, thereby reducing influence of the heat energy on life of the environmental sensitive electronic device 430.

In the present exemplary embodiment, the environmental sensitive electronic device package 400A has, for example, a bottom emission design or a top emission design. The disclosure is not limited hereto. In other exemplary embodiments that are not illustrated, the case CASE2 of the environmental sensitive electronic device package 400A may be further designed to have dual-sided light-emitting openings so that light is emitted from a top surface and a bottom surface at the same time, thereby achieving dual emission.

Since the environmental sensitive electronic device package of the disclosure has the side wall barrier structure that surrounds the environmental sensitive electronic device and that is disposed between any two substrates, the environmental sensitive electronic device package of the embodiment of the disclosure is provided with good water vapor and oxygen barrier properties. The environmental sensitive electronic device package of the disclosure further has a structure such as the thermal protrusion or a heat conductive material, wherein the thermal protrusion is disposed on the substrate and extends toward the environmental sensitive electronic device, and the heat conductive material is distributed throughout the filler layer or the thermal layer in the form of nano-sized particles. Therefore, the environmental sensitive electronic device package of the disclosure is also provided with good heat dissipation, thus effectively lengthening the life of the environmental sensitive electronic device.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An environmental sensitive electronic device package, comprising:
   a first substrate;
   a second substrate disposed above the first substrate;
   an environmental sensitive electronic device disposed on the first substrate and located between the first substrate and the second substrate;
   at least one first side wall barrier structure disposed on the second substrate and located between the first substrate and the second substrate, wherein the first side wall barrier structure is located on at least one side of the environmental sensitive electronic device;
   at least one thermal protrusion located on the second substrate, wherein the at least one thermal protrusion protrudes from the second substrate toward the environmental sensitive electronic device, and the at least one thermal protrusion is overlapped with the environmental sensitive electronic device; and
   a first filler layer located between the first substrate and the second substrate, wherein the first filler layer covers the environmental sensitive electronic device, the thermal protrusion, and the first side wall barrier structure.

2. The environmental sensitive electronic device package according to claim 1, wherein the first side wall barrier structure comprises a closed structure that surrounds the environmental sensitive electronic device, and the first side wall barrier structure surrounds the thermal protrusion.

3. The environmental sensitive electronic device package according to claim 1, wherein a cross-section of the first side wall barrier structure is in a shape of a trapezoid, rectangle, polygon, circle or ellipse, and the cross-section is perpendicular to the first substrate.

4. The environmental sensitive electronic device package according to claim 1, wherein a base area of the thermal protrusion is in a shape of a square, rectangle, polygon, circle or ellipse.

5. The environmental sensitive electronic device package according to claim 1, wherein the thermal protrusion is arranged in array on the second substrate.

6. The environmental sensitive electronic device package according to claim 1, wherein the first filler layer comprises a heat conductive material.

7. The environmental sensitive electronic device package according to claim 1 further comprising a conductive wire, wherein the conductive wire is disposed on the first substrate and located between the first substrate and the second substrate, and is electrically connected to the environmental sensitive electronic device.

8. The environmental sensitive electronic device package according to claim 1 further comprising:
- a third substrate disposed below the first substrate, wherein the first substrate is located between the second substrate and the third substrate;
- at least one second side wall barrier structure disposed on the third substrate and located between the first substrate and the third substrate;
- a thermal layer disposed on the third substrate and located between the first substrate and the third substrate, wherein the thermal layer covers the third substrate and the second side wall barrier structure;
- a thermal structure disposed on the first substrate and located between the first substrate and the third substrate, wherein the thermal structure surrounds the second side wall barrier structure, and the thermal structure is engaged with the thermal layer on the third substrate; and
- a second filler layer located between the first substrate and the third substrate, wherein the second filler layer covers the second side wall barrier structure.

9. The environmental sensitive electronic device package according to claim 8, wherein the thermal structure comprises a closed structure that surrounds the environmental sensitive electronic device.

10. The environmental sensitive electronic device package according to claim 8, wherein the thermal structure comprises a structure comprising a plurality of separated patterns that surrounds the environmental sensitive electronic device.

11. The environmental sensitive electronic device package according to claim 8, wherein the thermal layer is a heat conductive material.

12. The environmental sensitive electronic device package according to claim 8, wherein the second filler layer comprises a heat conductive material.

13. The environmental sensitive electronic device package according to claim 8 further comprising a case, wherein the first substrate, the second substrate, and the third substrate are installed in the case.

14. The environmental sensitive electronic device package according to claim 8, wherein a cross-section of the second side wall barrier structure is in a shape of a trapezoid, rectangle, polygon, circle or ellipse, and the cross-section is perpendicular to the first substrate.

* * * * *